(12) United States Patent
Seo et al.

(10) Patent No.: US 8,901,584 B2
(45) Date of Patent: Dec. 2, 2014

(54) LIGHT EMITTING DIODE, LIGHT EMITTING DIODE LAMP AND ILLUMINATING DEVICE

(75) Inventors: Noriyoshi Seo, Hiki-gun (JP); Atsushi Matsumura, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 22 days.

(21) Appl. No.: 13/255,209

(22) PCT Filed: Mar. 3, 2010

(86) PCT No.: PCT/JP2010/001476
§ 371 (c)(1),
(2), (4) Date: Sep. 7, 2011

(87) PCT Pub. No.: WO2010/103752
PCT Pub. Date: Sep. 16, 2010

(65) Prior Publication Data
US 2012/0007114 A1 Jan. 12, 2012

(30) Foreign Application Priority Data

Mar. 10, 2009 (JP) .................................. 2009-056780
Apr. 1, 2009 (JP) .................................. 2009-089300

(51) Int. Cl.
*H01L 33/00* (2010.01)
*H01L 23/00* (2006.01)
(Continued)

(52) U.S. Cl.
CPC ............... *H01L 33/30* (2013.01); *F21V 7/0083* (2013.01); *H01L 2224/05554* (2013.01); *F21Y*
(Continued)

(58) Field of Classification Search
USPC .................................. 257/98, 99, 94
See application file for complete search history.

(56) References Cited

U.S. PATENT DOCUMENTS 5,012,609 A 5/1991 Ignatius et al.
7,842,966 B2 * 11/2010 Watanabe et al. ............. 257/103
(Continued)

FOREIGN PATENT DOCUMENTS

JP 5-115219 A 5/1993
JP 09-037648 A 2/1997
(Continued)

OTHER PUBLICATIONS

T. M. Ritter et al., Energy Level Alignments in Strained-Layer GaInP/AlGaIn, Phys. Stat. Sol. (b) 211, 869 (1999).*

(Continued)

*Primary Examiner* — Mark Tornow
(74) *Attorney, Agent, or Firm* — Sughrue Mion, PLLC

(57) ABSTRACT

A light emitting diode including a compound semiconductor layer having at least a pn junction-type light emitting unit and a strain adjustment layer stacked on the light emitting unit, wherein the light emitting unit has a stacked structure containing a strained light emitting layer having a composition formula of $(Al_XGa_{1-X})_YIn_{1-Y}P$ (wherein X and Y are numerical values that satisfy $0 \le X \le 0.1$ and $0.39 \le Y \le 0.45$ respectively) and a barrier layer, and the strain adjustment layer is transparent to the emission wavelength and has a lattice constant that is smaller than the lattice constants of the strained light emitting layer and the barrier layer. The light emitting diode has an emission wavelength of not less than 655 nm, exhibits excellent monochromaticity, high output and/or high efficiency, and has a fast response speed.

21 Claims, 8 Drawing Sheets

(51) Int. Cl.
  *H01L 33/12* (2010.01)
  *H01L 33/30* (2010.01)
  *F21V 7/00* (2006.01)
  *F21Y 105/00* (2006.01)
  *F21Y 101/02* (2006.01)
  *F21V 7/09* (2006.01)
  *H01L 33/08* (2010.01)
  *H01L 33/20* (2010.01)

(52) U.S. Cl.
  CPC .. *2105/001* (2013.01); *H01L 24/06* (2013.01); *H01L 2224/48091* (2013.01); *H01L 2224/45144* (2013.01); *F21Y 2101/02* (2013.01); *F21V 7/09* (2013.01); *H01L 2224/73265* (2013.01); *H01L 2924/10158* (2013.01); *H01L 33/08* (2013.01); *H01L 33/12* (2013.01); *H01L 2224/05555* (2013.01); *H01L 33/20* (2013.01)
  USPC .................................. 257/94; 257/98; 257/99

(56) References Cited

U.S. PATENT DOCUMENTS

| | | | |
|---|---|---|---|
| 7,915,619 B2 * | 3/2011 | Nabekura et al. ............... | 257/79 |
| 2006/0267039 A1 | 11/2006 | Nakashima et al. | |
| 2007/0075327 A1 | 4/2007 | Arai et al. | |
| 2009/0008661 A1 | 1/2009 | Arimitsu | |
| 2010/0006818 A1 | 1/2010 | Matsumura | |

FOREIGN PATENT DOCUMENTS

| | | | | |
|---|---|---|---|---|
| JP | 09-106946 | A | 4/1997 | |
| JP | 11-087764 | A | 3/1999 | |
| JP | 2000-151024 | A | 5/2000 | |
| JP | 3230638 | B2 | 11/2001 | |
| JP | 2002-027831 | A | 1/2002 | |
| JP | 3373561 | B2 | 2/2003 | |
| JP | 2004-000093 | A | 1/2004 | |
| JP | 2004-221042 | A | 8/2004 | |
| JP | 2006-310534 | A | 11/2006 | |
| JP | 2007-013107 | A | 1/2007 | |
| JP | 2007-019057 | A | 1/2007 | |
| JP | 2007-096168 | A | 4/2007 | |
| JP | 2007-173534 | A | 7/2007 | |
| JP | 2007-173551 | A | 7/2007 | |
| JP | 2007-173575 | A | 7/2007 | |
| JP | 2008-016412 | A | 1/2008 | |
| JP | 2009-032752 | A | 2/2009 | |
| KR | 10-2000-0023055 | A | 4/2000 | |
| WO | WO2007/004741 | * | 1/2007 | ............. H01L 31/00 |
| WO | WO2007/073001 | * | 6/2007 | ............. H01L 27/15 |
| WO | 2007/091704 | A1 | 8/2007 | |
| WO | 2007/094476 | A1 | 8/2007 | |
| WO | 2008/099699 | A1 | 8/2008 | |

OTHER PUBLICATIONS

International Search Report PCT/JP2010/001476, Apr. 13, 2010.

Office Action dated Feb. 21, 2013, issued in Korean Patent Application No. 10-2011-7022869.

Decision of Rejection dated Jan. 21, 2014, and issued by the Japanese Patent Office in patent application No. 2009-089300.

Office Action dated Jan. 15, 2014, and issued by the Taiwan Intellectual Property Office in patent application No. 099106553.

Notice of Reasons for Refusal issued by the Japanese Patent Office in patent application No. 2009-089300 dated Sep. 17, 2013.

* cited by examiner

LIGHT EMITTING DIODE, LIGHT EMITTING DIODE LAMP AND ILLUMINATING DEVICE

CROSS REFERENCE TO RELATED APPLICATIONS

This application is a National Stage of International Application No. PCT/JP2010/001476 filed Mar. 3, 2010, claiming priorities based on Japan Patent Application Nos. 2009-056780 filed Mar. 10, 2009 and 2009-089300 filed Apr. 1, 2009, the contents of all of which are incorporated herein by reference in their entirety.

TECHNICAL FIELD

The present invention relates to a light emitting diode, a light emitting diode lamp and an illumination device, and relates particularly to a high-output red light emitting diode, and a light emitting diode lamp and an illumination device that use the light emitting diode.

BACKGROUND ART

In recent years, plant growth using artificial light sources has been the subject of much research. In particular, cultivation methods using illumination from light emitting diodes (LED), which exhibit excellent monochromaticity, provide favorable energy conservation and long life, and can be easily miniaturized, are garnering much attention. Based on the results of research to date, one emission wavelength band that has been confirmed as an effective light source for plant growth (photosynthesis) is red light having a wavelength within the region from 600 to 700 nm. Light within the wavelength vicinity of 660 to 670 nm exhibits particularly favorable reaction efficacy for photosynthesis, and is thus a preferred light source. Examples of conventional red light emitting diodes of this wavelength that have been investigated include those having light emitting layers composed of AlGaAs and InGaNP and the like, but a high-output light emitting diode has yet to be achieved (for example, see Patent Documents 1 to 3).

On the other hand, compound semiconductor LEDs having a light emitting layer composed of an aluminum-gallium-indium phosphide (composition formula: $(Al_XGa_{1-X})_YIn_{1-Y}P$, wherein $0 \leq X \leq 1$ and $0 \leq Y \leq 1$) are also known. Among these LEDs, a light emitting layer having the composition $Ga_{0.5}In_{0.5}P$ exhibits the longest wavelength, and the peak wavelength obtained from this light emitting layer is in the vicinity of 650 nm. Accordingly, achieving practical application of, and a high level of brightness for, compound semiconductor LEDs in the region to the long wavelength side of 655 nm has proven problematic.

Further, a light emitting unit having a light emitting layer composed of $(Al_XGa_{1-X})_YIn_{1-Y}P$ (wherein $0 \leq X \leq 1$ and $0 \leq Y \leq 1$) is generally formed on a monocrystalline substrate of gallium arsenide (GaAs), which is optically opaque to the light emitted from the light emitting layer and is not particularly strong mechanically.

Accordingly, much research is being conducted with the aims of obtaining higher brightness visible light LEDs and achieving further improvements in the mechanical strength of devices. In other words, techniques have recently been disclosed in which the opaque substrate material such as GaAs is removed, and a support layer that transmits the emitted light and is composed of a transparent material that exhibits superior mechanical strength to conventional materials is then bonded to form a junction LED (for example, see Patent Document 4). On the other hand, investigations have also been conducted, for laser devices having a different light emission mechanism, into light emitting layers having strain, but there are currently no practical applications of strained light emitting layers in the field of light emitting diodes (for example, see Patent Document 5).

Furthermore, investigations are also being pursued into light emitting diode light emitting units that utilize a quantum well structure. However, because the quantum effect obtained by utilizing a quantum well structure shortens the emission wavelength, this effect has been unable to be applied to techniques requiring wavelength lengthening (for example, see Patent Document 6).

CITATION LIST

Patent Documents

[Patent Document 1]
Japanese Unexamined Patent Application, First Publication No. Hei 9-37648
[Patent Document 2]
Japanese Unexamined Patent Application, First Publication No. 2002-27831
[Patent Document 3]
Japanese Unexamined Patent Application, First Publication No. 2004-221042
[Patent Document 4]
Japanese Patent (Granted) Publication No. 3,230,638
[Patent Document 5]
Japanese Unexamined Patent Application, First Publication No. 2000-151024
[Patent Document 6]
Japanese Patent (Granted) Publication No. 3,373,561

DISCLOSURE OF INVENTION

Problems to be Solved by the Invention

However, in order to enable practical application as an illumination light source for plant growth, energy conservation and cost factors mean that an LED having a high light emission efficiency must be used, and the electric power consumption and number of LEDs used must be reduced.

In order to enable practical application of LED illumination for plant growth, reductions in the electric power consumption, improved compactness and cost reductions are particularly desirable, and in the case of conventional AlGaAs-based LEDs having an emission wavelength within the 660 nm wavelength band, improvements in various properties including higher output, higher efficiency, reduced wavelength fluctuation and/or higher response speeds have been keenly sought.

Further, in terms of the lighting method employed, methods that employ a high-speed pulse system in order to reduce electric power consumption are also being investigated, and these methods require light emitting diodes with very high response speeds. Recent research has confirmed that when illumination is used for plant growth, energy conservation can be achieved by irradiating the plant with light, and subsequently extinguishing the light during the photosynthesis reaction. However, this requires light emitting diodes that have a response speed capable of coping with a high-speed pulsed current. Specifically, the response speed of the light emitting diode must be not more than 1,000 ns, and preferably 100 ns or less.

However, among light emitting layers composed of high emission efficiency $(Al_XGa_{1-X})_YIn_{1-Y}P$ (wherein $0 \leq X \leq 1$ and $0 \leq Y \leq 1$), the light emitting layer with the longest wavelength (the shortest band gap) that matches the lattice constant of the GaAs substrate used for epitaxial growth has a composition of $Ga_{0.5}In_{0.5}P$. The emission wavelength of this light emitting layer is 650 nm, and a longer wavelength than 650 nm cannot be obtained. In this manner, technical issues exist with regard to lengthening the emission wavelength to a value of 650 nm or greater, and therefore achieving practical application of, and/or improved efficiency for, such devices has proven impossible. In particular, no techniques exist for improving the output of LEDs having a long emission wavelength of 655 nm or greater.

On the other hand, in the field of illumination used for plant growth, light having an emission wavelength of 700 nm or greater may sometimes have the effect of inhibiting plant growth. As a result, red light of superior monochromaticity with an emission wavelength in the vicinity of 660 nm is preferred. Accordingly, a light used for plant growth preferably has an emission spectrum in which the emission intensity at 700 nm is less than 10% of the intensity at the peak emission wavelength.

The present invention has been developed in light of the above circumstances, and has an object of providing a light emitting diode that has an emission wavelength of not less than 655 nm, exhibits excellent monochromaticity, high output and/or high efficiency, and has a fast response speed. Further, another object of the invention is to provide a light emitting diode lamp that is ideal for illumination for plant growth, and an illumination device provided with such a light emitting diode lamp.

Means to Solve the Problems

In other words, the present invention relates to the aspects described below.

(1) A light emitting diode containing a compound semiconductor layer having at least a pn junction-type light emitting unit and a strain adjustment layer stacked on the light emitting unit, wherein the light emitting unit has a stacked structure containing a strained light emitting layer having a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively) and a barrier layer, and the strain adjustment layer is transparent to the emission wavelength and has a lattice constant that is smaller than the lattice constants of the strained light emitting layer and the barrier layer.

(2) The light emitting diode according to aspect (1), wherein the composition formula of the strained light emitting layer is $Ga_YIn_{1-Y}P$ (wherein Y is a numerical value that satisfies $0.39 \leq Y \leq 0.45$).

(3) The light emitting diode according to aspect (1) or (2), wherein the thickness of the strained light emitting layer is within a range from 8 to 30 nm.

(4) The light emitting diode according to any one of aspects (1) to (3), wherein the strained light emitting layer contains 8 to 40 layers.

(5) The light emitting diode according to any one of aspects (1) to (4), wherein the composition formula of the barrier layer is $(Al_XGa_{1-X})_YIn_{1-Y}P$ (wherein X and Y are numerical values that satisfy $0.3 \leq X \leq 0.7$ and $0.48 \leq Y \leq 0.52$ respectively).

(6) The light emitting diode according to any one of aspects (1) to (5), wherein the light emitting unit includes a cladding layer on one or both of the upper surface and the lower surface of the strained light emitting layer, and the composition formula of the cladding layer is $(Al_XGa_{1-X})_YIn_{1-Y}P$ (wherein X and Y are numerical values that satisfy $0.5 \leq X \leq 1$ and $0.48 \leq Y \leq 0.52$ respectively).

(7) The light emitting diode according to any one of aspects (1) to (6), wherein the composition formula of the strain adjustment layer is $(Al_XGa_{1-X})_YIn_{1-Y}P$ (wherein X and Y are numerical values that satisfy $0 \leq X \leq 1$ and $0.6 \leq Y \leq 1$ respectively).

(8) The light emitting diode according to any one of aspects (1) to (6), wherein the composition formula of the strain adjustment layer is $Al_XGa_{1-X}As_{1-Y}P_Y$ (wherein X and Y are numerical values that satisfy $0 \leq X \leq 1$ and $0.6 \leq Y \leq 1$ respectively).

(9) The light emitting diode according to any one of aspects (1) to (6), wherein the material of the strain adjustment layer is GaP.

(10) The light emitting diode according to any one of aspects (1) to (9), wherein the thickness of the strain adjustment layer is within a range from 0.5 to 20 μm.

(11) The light emitting diode according to any one of aspects (1) to (10), wherein a functional substrate is bonded to the surface of the compound semiconductor layer on the opposite side to the light extraction surface.

(12) The light emitting diode according to aspect (11), wherein the functional substrate is transparent.

(13) The light emitting diode according to aspect (11) or (12), wherein the material of the functional substrate is GaP.

(14) The light emitting diode according to any one of aspects (11) to (13), wherein the side surface of the functional substrate has a vertical surface that is positioned relatively closer to the compound semiconductor layer and is substantially perpendicular to the light extraction surface, and an inclined surface that is positioned relatively distant from the compound semiconductor layer and is inclined inwards relative to the light extraction surface.

(15) The light emitting diode according to any one of aspects (11) to (14), further including first and second electrodes provided on the light extraction surface side of the compound semiconductor layer, and a third electrode used for connection purposes that is provided on the back surface of the functional substrate.

(16) The light emitting diode according to aspect (15), wherein the first and second electrodes are ohmic electrodes.

(17) The light emitting diode according to any one of aspects (11) to (16), wherein the light extraction surface includes a rough surface.

(18) The light emitting diode according to any one of aspects (1) to (17), which is used for promoting photosynthesis during plant growth, and wherein the peak emission wavelength within the emission spectrum of the light emitting unit is within a range from 655 to 675 nm.

(19) The light emitting diode according to aspect (18), wherein the full width at half maximum of the emission spectrum is within a range from 10 to 40 nm.

(20) The light emitting diode according to aspect (18) or (19), wherein the emission intensity at an emission wavelength of 700 nm in the emission spectrum is less than 10% of the emission intensity at the peak emission wavelength.

(21) The light emitting diode according to any one of aspects (1) to (20), wherein the response speed (Tr) of the light emitting unit is not more than 100 ns.

(22) A light emitting diode lamp, including the light emitting diode according to any one of aspects (1) to (21).

(23) The light emitting diode lamp according to aspect (22), wherein the first or second electrode provided on the light extraction surface side of the light emitting diode, and the third electrode are connected substantially equipotentially.

(24) An illumination device, including the light emitting diode lamp according to aspect (22) or (23).

Effect of the Invention

The light emitting diode of the present invention includes a compound semiconductor layer containing a light emitting unit having a strained light emitting layer with a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively). By employing AlGaInP as the material for the strained light emitting layer, the light emission efficiency and the response speed from the light emitting unit can be improved. Further, by restricting the composition of the strained light emitting layer to the ranges described above, a light emitting diode with an emission wavelength of 655 nm or greater can be achieved.

Further, in the light emitting diode of the present invention, a strain adjustment layer is provided on the light emitting unit. This strain adjustment layer is transparent to the emission wavelength, and therefore enables a high-output and/or high-efficiency light emitting diode to be achieved without absorbing the light emitted from the light emitting unit. Moreover, this strain adjustment layer has a smaller lattice constant than the lattice constant of the GaAs substrate, and therefore warping of the compound semiconductor layer can be suppressed. As a result, fluctuations in the amount of strain within the strained light emitting layer are reduced, enabling a light emitting diode with excellent monochromaticity to be obtained.

Accordingly, the present invention is able to provide a light emitting diode that has an emission wavelength of not less than 655 nm, exhibits excellent monochromaticity, high output and/or high efficiency, and has a fast response speed. Further, the present invention is also able to provide a high-output light emitting diode that has a light emission efficiency approximately 4 times or more that of conventional AlGaAs-based light emitting diodes.

Furthermore, the light emitting diode lamp of the present invention includes a light emitting diode that has an emission wavelength of not less than 655 nm, exhibits excellent monochromaticity, high output and/or high efficiency, and has a fast response speed. Accordingly, a light emitting diode lamp that is ideal for illumination for plant growth, and an illumination device provided with such a light emitting diode lamp, can be provided.

EMBODIMENTS FOR CARRYING OUT THE INVENTION

Figure 1:
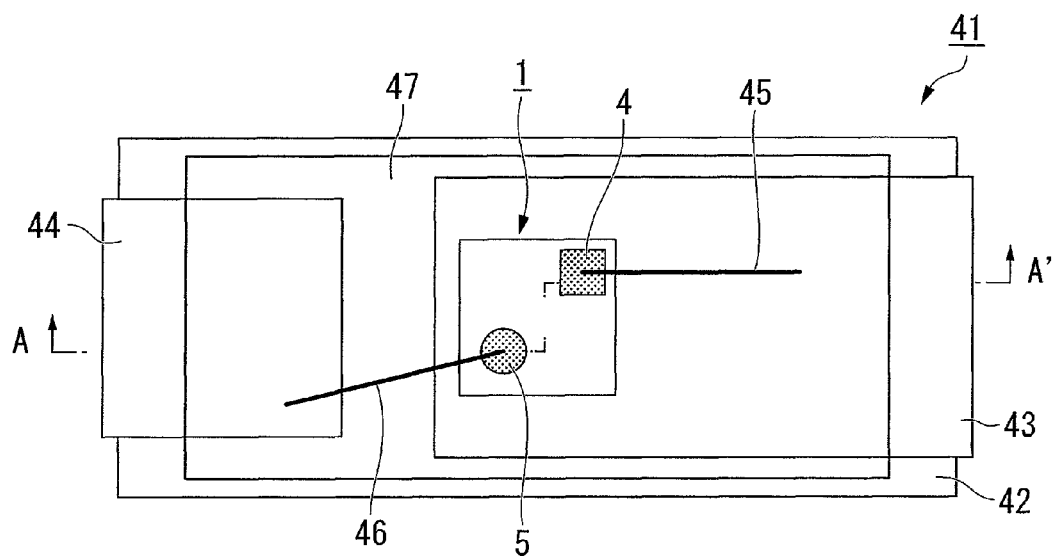
FIG. 1 is a plan view of a light emitting diode lamp using a light emitting diode according to an embodiment of the present invention.

As follows is a detailed description of a light emitting diode, which represents one embodiment of the application of the present invention, and a light emitting diode lamp that uses the light emitting diode, with reference to the drawings. The drawings used in the following description have in some cases been drawn with certain features enlarged, in order to assist with comprehension of those features, and as a result, the dimensional ratios between each of the structural components in the drawings may not necessarily represent the actual ratios.

<Light Emitting Diode Lamp>

Figure 2:
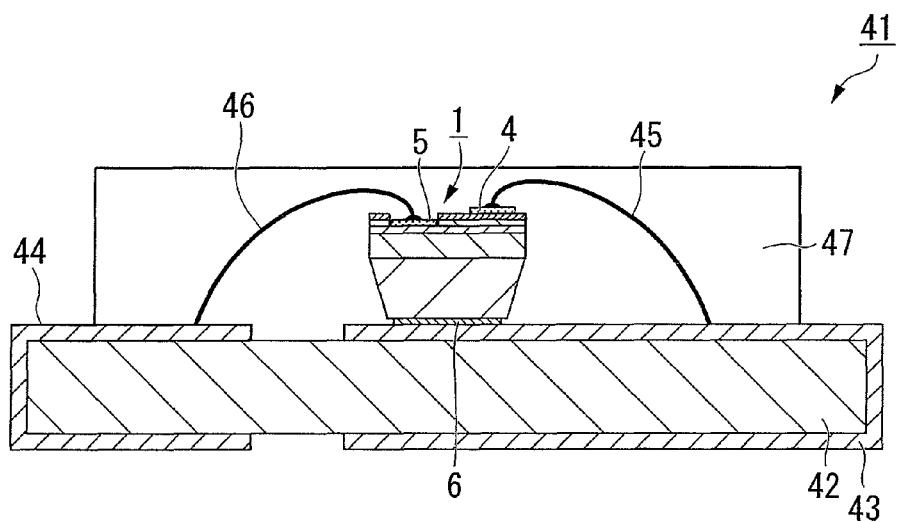
FIG. 2 is a schematic cross-sectional view along the line A-A' in FIG. 1, illustrating the light emitting diode lamp using a light emitting diode according to an embodiment of the present invention.

FIG. 1 and FIG. 2 are diagrams that describe a light emitting diode lamp which uses a light emitting diode that represents one embodiment of the application of the present invention, wherein FIG. 1 is a plan view and FIG. 2 is a cross-sectional view along the line A-A' in FIG. 1.

As illustrated in FIG. 1 and FIG. 2, in a light emitting diode lamp 41 that uses a light emitting diode 1 of the present embodiment, at least one light emitting diode 1 is mounted on the surface of a mounting substrate 42. More specifically, an n-electrode terminal 43 and a p-electrode terminal 44 are provided on the surface of the mounting substrate 42. Further, an n-ohmic electrode 4 that acts as a first electrode for the light emitting diode 1 and the n-electrode terminal 43 on the mounting substrate 42 are connected using a gold wire 45 (wire bonding). On the other hand, a p-ohmic electrode 5 that acts as a second electrode for the light emitting diode 1 and the p-electrode terminal 44 on the mounting substrate 42 are connected using a gold wire 46. Moreover, as illustrated in FIG. 2, a third electrode 6 is provided on the opposite surface of the light emitting diode 1 to the surface on which the n- and p-type ohmic electrodes 4 and 5 are provided. The light emitting diode 1 is connected to the n-electrode terminal 43 and secured to the mounting substrate 42 via this third electrode 6. The n-ohmic electrode 4 and the third electrode 6 are connected electrically via the n-electrode terminal 43 so as to be equipotential or substantially equipotential. The surface of the mounting substrate 42 on which the light emitting diode 1 is mounted is sealed using a typical epoxy resin 47.

<Light Emitting Diode>

Figure 3:
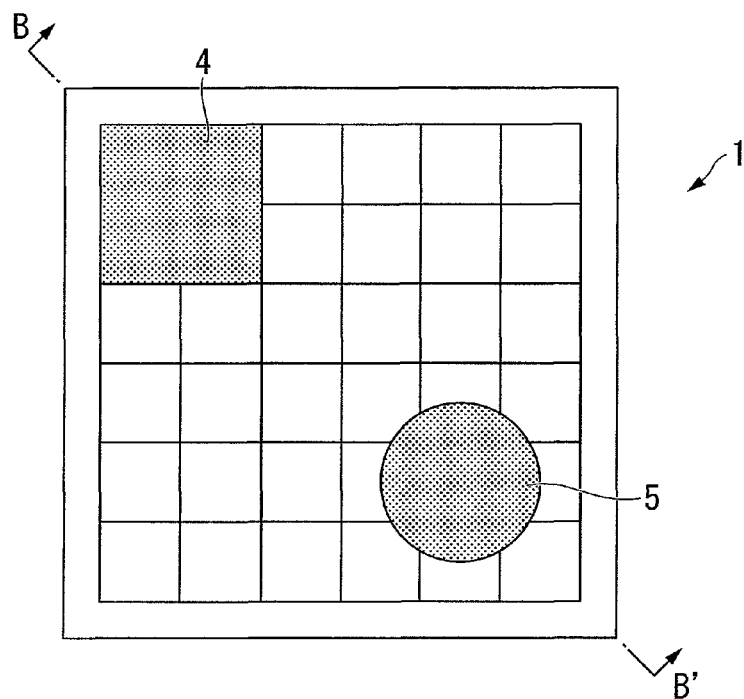
FIG. 3 is a plan view of a light emitting diode according to an embodiment of the present invention.
Figure 4:
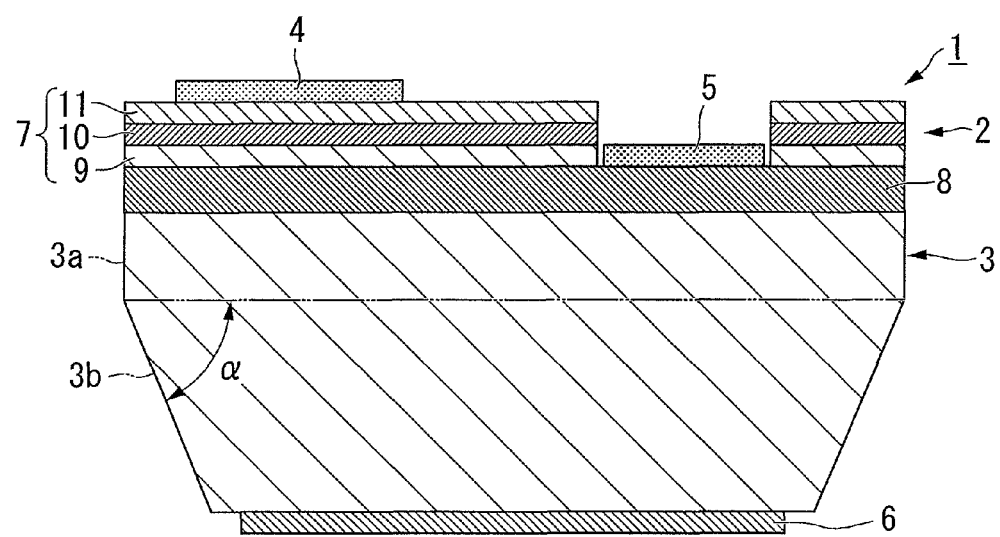
FIG. 4 is a schematic cross-sectional view along the line B-B' in FIG. 3, illustrating the light emitting diode according to an embodiment of the present invention.

FIG. 3 and FIG. 4 are diagrams describing a light emitting diode that represents one embodiment of the application of the present invention, wherein FIG. 3 is a plan view and FIG. 4 is a cross-sectional view along the line B-B' in FIG. 3. As illustrated in FIG. 3 and FIG. 4, the light emitting diode 1 of this embodiment is a light emitting diode in which a compound semiconductor layer 2 is bonded to a functional substrate 3. The basic structure of the light emitting diode 1 includes an n-ohmic electrode (first electrode) 4 and a p-ohmic electrode (second electrode) 5 provided on a main light extraction surface, and a third electrode 6 provided on the opposite surface of the functional substrate 3 to the surface that is bonded to the compound semiconductor layer 2. In this embodiment, the main light extraction surface refers to the surface of the compound semiconductor layer 2 on the opposite side to the surface bonded to the functional substrate 3.

As illustrated in FIG. 4, the compound semiconductor layer (also referred to as the epitaxial growth layer) 2 has a structure in which a pn junction-type light emitting unit 7 and a strain adjustment layer 8 are stacked sequentially. The structure of this compound semiconductor layer 2 may also include conventional functional layers according to need. For example, conventional layer structures such as a contact layer for reducing the contact resistance of the ohmic electrodes, an electric current diffusion layer for achieving planar diffusion of the device drive current across the entire light emitting unit, or in contrast, a current inhibition layer or current constriction layer for restricting the region through which the device drive current is able to flow, may be provided as required. The compound semiconductor layer 2 is preferably formed by epitaxial growth on top of a GaAs substrate.

As illustrated in FIG. 4, the light emitting unit 7 is formed by sequentially stacking at least a p-type lower cladding layer 9, a light emitting layer 10 and an n-type upper cladding layer 11 on the strain adjustment layer 8. In other words, in terms of obtaining high-intensity light emission, the light emitting unit 7 is preferably a so-called double hetero (abbreviation: DH) structure including a lower cladding layer 9 and an upper cladding layer 11, which are positioned in opposing positions on the lower and upper sides of the light emitting layer 10 to "confine" emitted light and carriers that give rise to radiative recombination within the light emitting layer 10.

Figure 5:
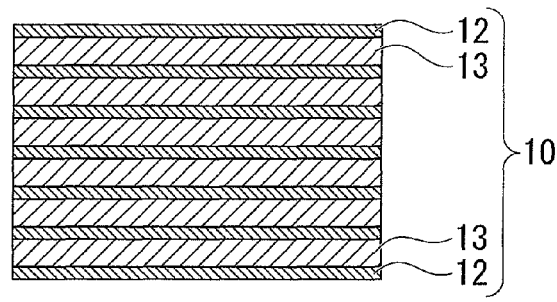
FIG. 5 is an enlarged cross-sectional view describing the structure of the light emitting unit of a light emitting diode according to an embodiment of the present invention.

As illustrated in FIG. 5, the light emitting layer 10 controls the emission wavelength of the light emitting diode (LED), and therefore preferably has a well structure. In other words, the light emitting layer 10 is preferably a multilayer structure composed of strained light emitting layers (also referred to as well layers) 12 and barrier layers 13 in which a strained light emitting layer 12 is positioned at each of the two outer edges of the structure.

The thickness of the light emitting layer 10 is preferably within a range from 0.02 to 2 μm. Further, there are no particular limitations on the conduction type of the light emitting layer 10, and an undoped, p-type or n-type layer may be selected. In order to enhance the light emission efficiency, either an undoped layer or a layer having a carrier concentration of less than $3 \times 10^{17}$ cm$^{-3}$, which offers more favorable crystallinity, is preferred.

Each of the strained light emitting layers 12 has a composition represented by $(Al_XGa_{1-X})_YIn_{1-Y}P$ (wherein X and Y are numerical values that satisfy 0≤X≤1 and 0≤Y≤1 respectively). The value of X is preferably not more than 0.1, and is more preferably 0. Further, the value of Y is preferably within a range from 0.37 to 0.46, and more preferably within a range from 0.39 to 0.45. By restricting the material of the strained light emitting layer 12 to materials that satisfy the above-mentioned numerical ranges, an emission wavelength within a range from 655 to 675 nm can be achieved. However, in such cases, the strained light emitting layer 12 adopts a structure having a different lattice constant from the other structural portions, resulting in the development of strain in the compound semiconductor layer 2. As a result, there is a possibility that detrimental crystal defects may occur.

The thickness of each strained light emitting layer 12 is preferably within a range from 8 to 30 nm. If the strained light emitting layer 12 is a thin film with a thickness of less than approximately 6 nm, then a quantum effect of the well structure causes a shortening of the emission wavelength, making it impossible to achieve the desired emission wavelength of 655 nm or greater. Accordingly, allowing for fluctuation in the thickness, the thickness of the strained light emitting layer 12 is preferably at least 8 nm in order to prevent quantum effects. In consideration of ease of control of the thickness, a thickness of at least 10 nm is preferred. On the other hand, if the thickness of the strained light emitting layer 12 exceeds 30 nm, then the amount of strain tends to become too great, which increases the likelihood of crystal defects and surface anomalies, and is therefore undesirable.

Each of the barrier layers 13 has a composition represented by $(Al_XGa_{1-X})_YIn_{1-Y}P$ (wherein X and Y are numerical values that satisfy 0≤X≤1 and 0≤Y≤1 respectively). The value of X is preferably within a range from 0.3 to 0.7, and is more preferably within a range from 0.4 to 0.6. Further, the value of Y is preferably within a range from 0.48 to 0.52, and more preferably within a range from 0.49 to 0.51. Further, the lattice constant of the barrier layer 13 is typically the same as, or less than, that of the GaAs substrate.

The thickness of each barrier layer 13 is preferably greater than the thickness of the strained light emitting layer 12. This enables the light emission efficiency of the strained light emitting layers 12 to be increased. Further, as well as optimizing the light emission efficiency, the barrier layers 13 must also alleviate the strain generated within the strained light emitting layers 12. Accordingly, the thickness of each barrier layer 13 is preferably at least 15 nm, and is more preferably 20 nm or greater. On the other hand, if the thickness of the barrier layer 13 exceeds 50 nm, then it approaches the emission wavelength, and optical effects may arise such as light interference or Bragg reflection. Accordingly, the thickness of each barrier layer 13 is preferably not more than 50 nm, and more preferably 40 nm or less.

As mentioned have, adopting a structure in which the strained light emitting layer 12 is relatively thinner and the barrier layer 13 is relatively thicker enables the strain of the strained light emitting layer 12 to be absorbed by the barrier layer 13, reducing the likelihood of crystal defects in the strained light emitting layer 12.

In the multilayer structure composed of the strained light emitting layers 12 and the barrier layers 13, there are no particular limitations on the number of alternately stacked pairs of layers, with each pair composed of a strained light emitting layer 12 and a barrier layer 13, but at least 8 pairs and not more than 40 pairs is preferable. In other words, the light emitting layer 10 preferably includes from 8 to 40 strained light emitting layers 12. Achieving favorable light emission efficiency for the light emitting layer 10 requires at least 8 strained light emitting layers 12. On the other hand, because the strained light emitting layers 12 and the barrier layers 13 have low carrier concentration levels, if the number of pairs of layers is too large, then the forward voltage (VF) tends to increase. Consequently, the number of pairs of layers is preferably not more than 40, and more preferably 30 or less. Furthermore, the strain within each of the strained light emitting layers 12 is a stress that occurs within the light emitting layer 10 as a result of the difference in lattice constants between the epitaxial growth substrate and the light emitting unit 7. Accordingly, if the number of alternately stacked pairs of the strained light emitting layer 12 and the barrier layer 13 exceeds the above range, namely if the number of strained light emitting layers 12 contained within the light emitting layer 10 exceeds the above range, then the light emitting layer 10 is unable to withstand the strain, resulting in the generation of crystal defects and the occurrence of problems such as a deterioration in the surface state and a reduction in the light emission efficiency.

By restricting the material of the strained light emitting layer 12 to materials that satisfy the numerical ranges mentioned above, the light emitting layer 10 (the light emitting unit 7) preferably exhibits a peak wavelength within the emission spectrum within a range from 655 to 675 nm, and more preferably within a range from 660 to 670 nm. An emission wavelength within this range is known to be an emission wavelength that is suitable as a light source for plant growth (photosynthesis), and exhibits a high degree of reaction efficacy for photosynthesis.

On the other hand, if light within the long wavelength region of 700 nm or greater is used, then a reaction that inhibits plant growth occurs, and therefore the amount of light within this long wavelength region is preferably minimized. Accordingly, in order to achieve efficient plant growth, red light sources for which the intensity of light within the wavelength region from 655 to 675 nm that is ideal for promoting photosynthesis is strong, but which include no light in the long wavelength region of 700 nm or greater, are the most desirable.

Furthermore, in order to achieve the type of desirable red light source described above, the full width at half maximum of the emission spectrum must be narrow. On the other hand, the full width at half maximum narrows close to quantization conditions, which tend to increase the possibility of wavelength fluctuations, and as a result, the full width at half maximum of the emission spectrum is preferably within a range from 10 to 40 nm. Moreover, the emission intensity within the emission spectrum at an emission wavelength of 700 nm is preferably less than 10% of the emission intensity at the above-mentioned peak emission wavelength. In addition, the response speed (rise time: Tr) of the light emitting layer 10 is preferably not more than 100 ns.

A light emitting diode 1 having a light emitting layer 10 with the types of properties described above can be used favorably as illumination (a light emitting diode lamp or an illumination device containing a light emitting diode lamp) for promoting photosynthesis during plant growth.

The term "illumination device" describes a device containing at least a substrate on which wiring and/or through-holes and the like are formed, a plurality of light emitting diode lamps attached to the surface of the substrate, and a reflector or shade which has a U-shaped cross-section, with the light emitting diode lamps provided inside the bottom of the U-shape.

<One Example of the Illumination Device>

Figure 10:
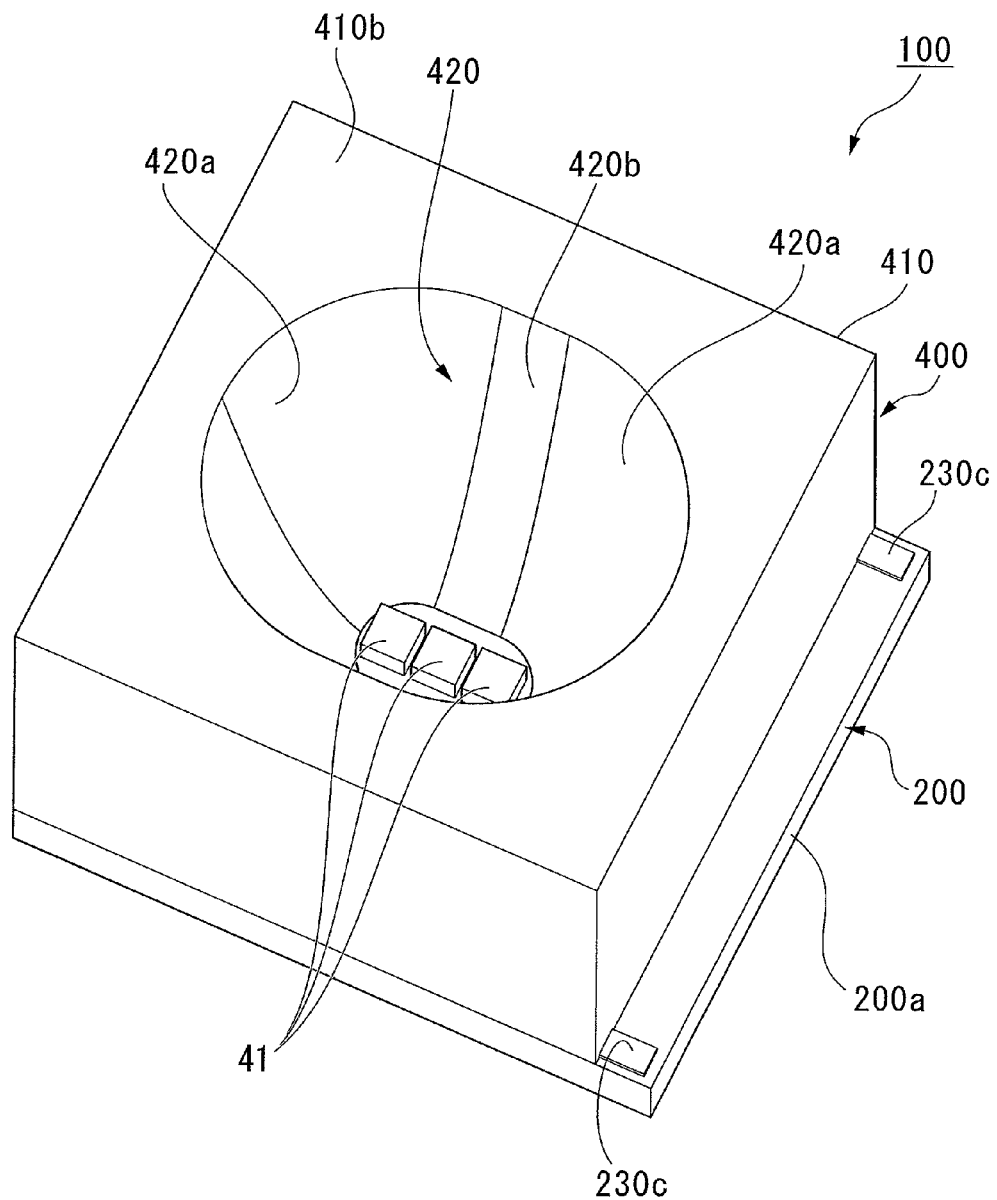
FIG. 10 is a perspective view illustrating an illumination device according to an embodiment of the present invention.

FIG. 10 illustrates a perspective view of one example of the illumination device according to the present embodiment.

An illumination device 100 illustrated in FIG. 10 includes basically a circuit board 200, light emitting diode lamps 41 mounted on the circuit board 200, and a reflector 400 disposed on top of the circuit board 200.

The circuit board 200 is composed basically of a substrate body formed from aluminum, an insulation layer stacked on top of the substrate body, and a wiring pattern formed from a conductor such as Cu formed on top of the insulation layer. Further, one side 200a of this circuit board 200 protrudes beyond the reflector 400, thereby exposing a portion of the surface of the circuit board 200.

Furthermore, the wiring pattern is composed of a pair of extraction electrode patterns, and six terminal electrode patterns that extend from one end of each of the extraction electrode patterns towards substantially the center of the circuit board 200. Each of three light emitting diode lamps 41 is connected to one pair of these terminal electrode patterns, meaning the light emitting diode lamps 41 are connected in a mutually parallel relationship. Further, the other end of each of the extraction electrode patterns extends to, and is exposed on, the side 200a of the circuit board 200, and these exposed portions function as external terminals 230c.

As illustrated in FIG. 10, in this example of the present embodiment, all three of the light emitting diode lamps 41 are mounted in substantially the center of the circuit board 200, and are aligned in a straight line with an equal spacing between each of the light emitting diode lamps 41. The positive electrodes and negative electrodes of the light emitting diode lamps 41 are connected electrically to the above-mentioned terminal electrode patterns.

As illustrated in FIG. 10, the reflector 400 is composed basically of a substantially cubic reflector body 410 formed from aluminum or an aluminum alloy or the like, in which is provided a reflective surface 420.

As illustrated in FIG. 10, the reflective surface 420 is composed of a pair of semicircular paraboloidal surfaces 420a, and a pair of parabolic cylindrical surfaces 420b disposed between the semicircular paraboloidal surfaces 420a.

Further, the thickness of the reflector body 410, or in other words, the height of the reflective surface 420 along the direction of light emission, may be set appropriately in accordance with the size of the light emitting diode lamps 41 and the spacing between the light emitting diode lamps 41, but is preferably set within a range from 5.0 mm to 20.0 mm.

<Another Example of the Illumination Device>

Figure 11:
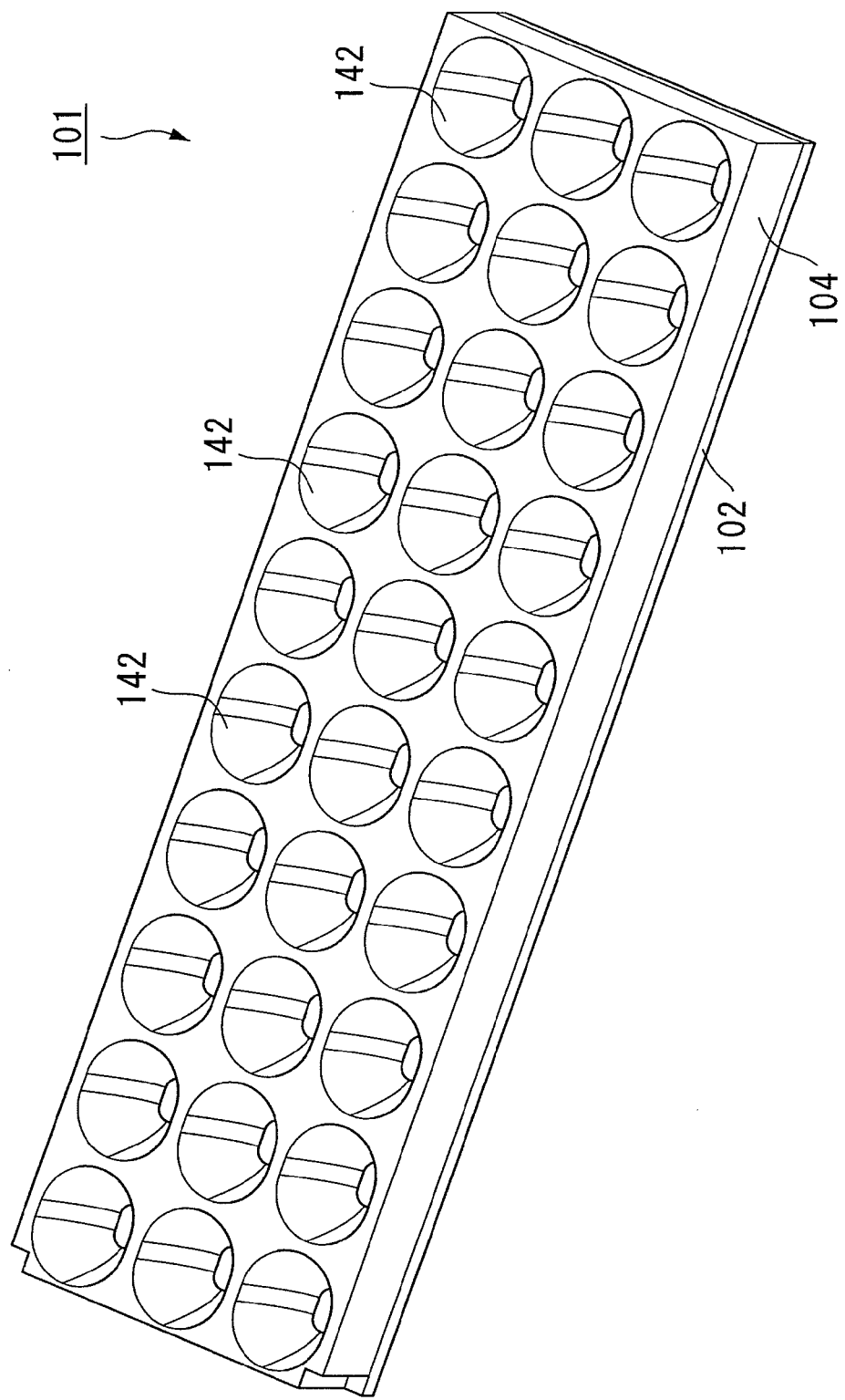
FIG. 11 is a perspective view illustrating an illumination device according to another embodiment of the present invention.

FIG. 11 illustrates a perspective view of another example of the illumination device according to the present embodiment.

An illumination device 101 illustrated in FIG. 11 includes basically a circuit board 102, light emitting diode lamps 41 mounted on the circuit board 102, and a reflector 104 disposed on top of the circuit board 102. In the illumination device 101 of this example, the reflector 104 has a total of 30 reflective surfaces 142 arranged in 10 rows×3 columns. Three light emitting diode lamps 41 are provided inside each reflective surface 142. The overall illumination device 101 includes a total of 90 light emitting diode lamps 41.

The detailed shape of each reflective surface 142 is substantially the same as that described above for the reflective surface of the illumination device 100, and includes a pair of semicircular paraboloidal surfaces, and a pair of parabolic cylindrical surfaces disposed between the semicircular paraboloidal surfaces.

Further, the structure of the light emitting layer 10, including the composition, the layer thicknesses and the number of layers, may be selected appropriately in order to achieve the properties described above.

As illustrated in FIG. 4, the lower cladding layer 9 and the upper cladding layer 11 are provided on the lower surface and the upper surface respectively of the light emitting layer 10. Specifically, the lower cladding layer 9 is provided on the lower surface of the light emitting layer 10 and the upper cladding layer 11 is provided on the upper surface of the light emitting layer 10.

The material for the lower cladding layer 9 and the upper cladding layer 11 is preferably a material that has a larger band gap than the strained light emitting layer 12 of the light emitting layer 10, and a material that has a larger band gap than the barrier layer 13 is even more preferred. Examples of such materials include compounds having a composition represented by $Al_XGa_{1-X}As$ and compounds having a composition represented by $(Al_XGa_{1-X})_YIn_{1-Y}P$ (wherein X and Y are numerical values that satisfy $0 \le X \le 0.1$ and $0 \le Y \le 1$ respectively). In the above formulas, the value of X preferably has a lower limit of at least 0.3, and more preferably 0.5 or greater. Further, the value of Y is preferably within a range from 0.48 to 0.52, and more preferably within a range from 0.49 to 0.51.

The lower cladding layer 9 and the upper cladding layer 11 have differing polarities. The carrier concentration and thickness of both the lower cladding layer 9 and the upper cladding layer 11 may be set within conventionally preferred ranges, and these conditions are preferably optimized so as to maximize the light emission efficiency of the light emitting layer 10. Further, warping of the compound semiconductor layer 2 may also be reduced by controlling the composition of the lower cladding layer 9 and the upper cladding layer 11.

Specifically, for the lower cladding layer 9, the use of a semiconductor material composed of a Mg-doped p-type $(Al_XGa_{1-X})_YIn_{1-Y}P$ (wherein X and Y are numerical values that satisfy $0.3 \leq X \leq 1$ and $0 \leq Y \leq 1$ respectively) is preferred. Further, the carrier concentration is preferably within a range from $2 \times 10^{17}$ to $2 \times 10^{18}$ cm$^{-3}$, and the thickness is preferably within a range from 0.5 to 5 μm.

On the other hand, for the upper cladding layer 11, the use of a semiconductor material composed of a Si-doped n-type $(Al_XGa_{1-X})_YIn_{1-Y}P$ (wherein X and Y are numerical values that satisfy $0.3 \leq X \leq 1$ and $0 \leq Y \leq 1$ respectively) is preferred. Further, the carrier concentration is preferably within a range from $1 \times 10^{17}$ to $1 \times 10^{18}$ cm$^{-3}$, and the thickness is preferably within a range from 0.5 to 2 μm. The polarities of the lower cladding layer 9 and the upper cladding layer 11 may be selected with due consideration of the structure of the compound semiconductor layer 2.

Further, intermediate layers may be provided between the lower cladding layer 9 and the light emitting layer 10, between the light emitting layer 10 and the upper cladding layer 11, and between the upper cladding layer 11 and the strain adjustment layer 8, in order to ensure gradual change of the band discontinuity between the various sets of layers. In such cases, each of the intermediate layers is preferably formed from a semiconductor material having a forbidden bandwidth that is midway between that of the two layers.

Furthermore, conventional layer structures such as a contact layer for reducing the contact resistance of the ohmic electrodes, an electric current diffusion layer for achieving planar diffusion of the device drive current across the entire light emitting unit, or in contrast, a current inhibition layer or current constriction layer for restricting the region through which the device drive current is able to flow, may be provided on top of the layers of the light emitting unit 7.

As illustrated in FIG. 4, the strain adjustment layer 8 is provided beneath the light emitting unit 7. This strain adjustment layer 8 is provided for the purpose of alleviating the strain that is produced due to the strained light emitting layer 12 during epitaxial growth of the compound semiconductor layer 2 on the GaAs substrate.

Further, the strain adjustment layer 8 is transparent to the emission wavelength from the light emitting unit 7 (the light emitting layer 10).

Moreover, the strain adjustment layer 8 has a lattice constant that is smaller than the lattice constants of the strained light emitting layer 12 and the barrier layer 13. The lattice constant of the strain adjustment layer 8 is also smaller than the lattice constant of the GaAs substrate used during formation of the compound semiconductor layer 2 (namely, formation by epitaxial growth). More specifically, if the lattice constant of the strain adjustment layer 8 having the composition described below is termed A, the lattice constant of the barrier layer 13 is termed B, and the lattice constant of the strained light emitting layer 12 is termed C, then these lattice constants satisfy the relationship A<B<C.

As the strain adjustment layer 8, a material having a composition represented by $(Al_XGa_{1-X})_YIn_{1-Y}P$ (wherein X and Y are numerical values that satisfy $0 \leq X \leq 1$ and $0.6 \leq Y \leq 1$ respectively) can be used. The value of X varies depending on the structure of the compound semiconductor layer 2, but because materials having a low Al concentration are chemically stable, X is preferably not more than 0.5, and is most preferably 0. Further, the lower limit for the value of Y is preferably at least 0.6. If a comparison is made between structures in which the amount of strain within the light emitting layer 10 (the strained light emitting layers 12) is the same, then a smaller value of Y results in a reduction in the size of the strain adjustment effect provided by the strain adjustment layer 8. This means that the thickness of the strain adjustment layer 8 must be increased, resulting in increased time and cost for deposition of the strain adjustment layer 8, and therefore the value of Y is preferably at least 0.6, and is more preferably 0.8 or greater.

Further, a group III-V semiconductor material that is transparent to the emission wavelength and has a composition represented by $Al_XGa_{1-X}As_{1-Y}P_Y$ (wherein X and Y are numerical values that satisfy $0 \leq X \leq 1$ and $0.6 \leq Y \leq 1$ respectively) may also be used favorably as the strain adjustment layer 8. In the case of a strain adjustment layer 8 having this composition, the lattice constant varies depending on the value of Y. Larger values of Y result in a smaller lattice constant. Further, the degree of transparency relative to the emission wavelength is related to the values of both X and Y, and therefore the values of X and Y are preferably selected so as to achieve a transparent material.

Moreover, GaP, and preferably Mg-doped p-type GaP or the like, may also be used favorably as the strain adjustment layer 8. This GaP requires no adjustment of the composition and also exhibits a large strain adjustment effect, and is therefore the most preferred material for the strain adjustment layer 8 in terms of productivity and stability.

The strain adjustment layer 8 has a smaller lattice constant than the lattice constant of the GaAs substrate that functions as the substrate used for epitaxial growth of the compound semiconductor layer 2, and therefore has the ability to alleviate fluctuations in the amount of strain incorporated within the strained light emitting layers 12. Accordingly, providing the strain adjustment layer 8 has the effects of improving the uniformity of properties such as the emission wavelength, and preventing the occurrence of crystal defects such as cracks. The thickness of the strain adjustment layer 8 is preferably within a range from 0.5 to 20 μm, and is more preferably within a range from 3 to 15 μm. If the thickness is less than 0.5 μm, then the thickness is insufficient to alleviate fluctuations in the amount of strain incorporated within the strained light emitting layers 12, whereas if the thickness exceeds 20 μm, then the growth time becomes overly long, and the production costs increase undesirably.

Furthermore, by controlling the composition of the strain adjustment layer 8, warping of the compound semiconductor layer 2 can be reduced, and therefore a light emitting diode 1 having a narrow in-plane wavelength distribution can be produced. Moreover, in cases such as the present embodiment where a functional substrate 3 and the compound semiconductor layer 2 are bonded together, if the amount of warping of the compound semiconductor layer 2 is large, then problems such as cracking may occur, and therefore it is desirable to minimize warping of the compound semiconductor layer 2.

Figure 6:
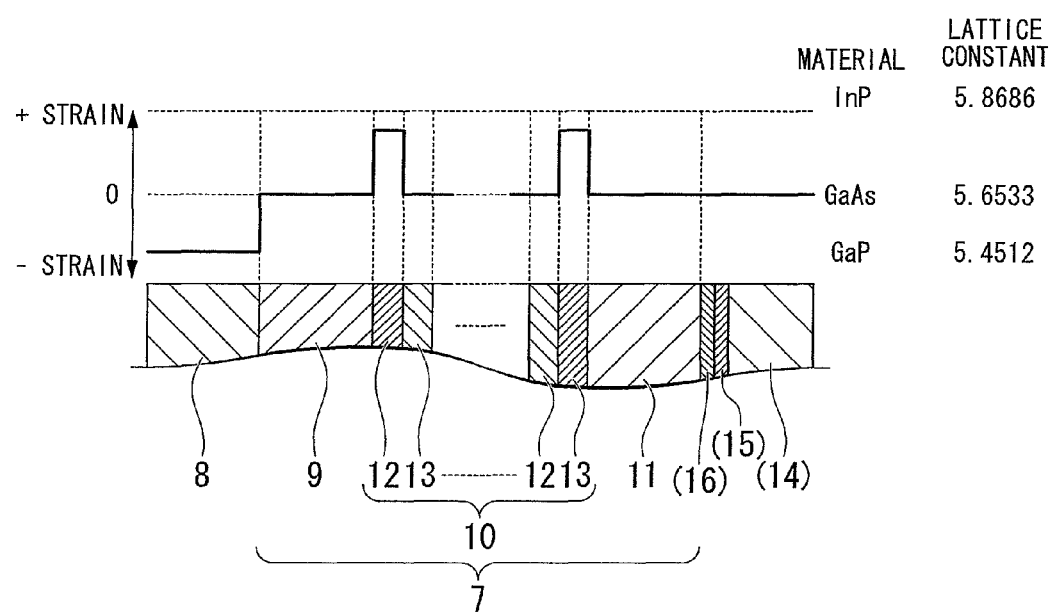
FIG. 6 is a diagram for describing the mechanism for alleviation of the strain within the strained light emitting layer of a light emitting diode according to an embodiment of the present invention.

Next is a description of the mechanism by which the strain adjustment layer 8 alleviates strain within the compound semiconductor layer 2 (namely, the lattice constant relationship between the strain adjustment layer 8 and the compound semiconductor layer 2), with reference to FIG. 6.

As illustrated in FIG. 6, the lattice constant of the strain adjustment layer 8 is smaller than the lattice constant of the GaAs substrate that acts as the standard. This state is referred to as −(negative) strain. In contrast, the lattice constant of the strained light emitting layer 12 within the light emitting layer 10 has a larger value than the lattice constant of the GaAs substrate that acts as the standard. This is referred to as +(positive) strain. In the present invention, it was discovered that the existence of − strain caused by the strain adjustment layer 8 had the effect of reducing fluctuation in the + strain which must be introduced into the strained light emitting layer 12 in order to lengthen the emission wavelength. As described above, the emission wavelength of the strained light emitting layer 12 is determined by the thickness, the composition and the amount of strain within the strained light emitting layer 12. In this manner, because the number of factors that influence the emission wavelength of the strained light emitting layer 12 is large, the degree of fluctuation in the emission wavelength tends to increase due to a synergistic effect of the fluctuation in each of these factors.

For example, the strained light emitting layer 12 is preferably a thin film having a thickness of not more than 30 nm, but being a thin film, controlling the thickness to achieve uniform thickness is problematic. Because there is a correlation between the thickness and the amount of introduced strain, fluctuations in the thickness of the strained light emitting layer 12 cause fluctuations in the amount of introduced strain, resulting in fluctuations in the emission wavelength of the strained light emitting layer 12. It was discovered that, during formation of the compound semiconductor layer 2, by providing the strain adjustment layer 8 on top of the light emitting unit 7 (beneath the light emitting unit 7 in FIG. 4) which contains the strained light emitting layers 12 having + strain, the − strain of this strain adjustment layer 8 was able to bring the strain that had deviated significantly towards the + side as a result of fluctuation in the thickness of the strained light emitting layer 12 back towards the − side, thereby reducing the fluctuation in the amount of strain within the strained light emitting layer 12. This effect of the strain adjustment layer 8 operates in a similar manner in those cases where the cause of the fluctuation in the amount of strain in the strained light emitting layer 12 is fluctuation in the composition of the strained light emitting layer 12.

In the structure of a conventional light emitting diode that lacks the strain adjustment layer 8, because large fluctuations occur in properties such as the emission wavelength, it has proven difficult to satisfy quality requirements. In contrast, the light emitting diode 1 of the present embodiment has a device structure that includes the strain adjustment layer 8 beneath the light emitting unit 7. As a result, the amount of strain within the strained light emitting layer 12 that is required to achieve the desired wavelength lengthening can be made more uniform throughout the plane of the light emitting layer 10, thereby reducing fluctuations in the emission wavelength and the output properties. Further, the surface state of the compound semiconductor layer 2 is also improved.

As illustrated in FIG. 4, the functional substrate 3 is bonded to the compound semiconductor layer 2 on the side of the strain adjustment layer 8. The functional substrate 3 is formed from a material that has sufficient strength to mechanically support the light emitting unit 7, has a broad forbidden band width that enables transmission of the light emitted from the light emitting unit 7, and is optically transparent to the emission wavelength from the light emitting layer 10. For example, the functional substrate 3 may be formed from group III-V compound semiconductor crystals such as gallium phosphide (GaP), aluminum gallium arsenide (AlGaAs) or gallium nitride (GaN), group II-VI compound semiconductor crystals such as zinc sulfide (ZnS) or zinc selenide (ZnSe), group IV semiconductor crystals such as hexagonal or cubic silicon carbide (SiC), or an insulating substrate such as glass or sapphire. Of these, GaP or the like is preferred.

On the other hand, a functional substrate having a highly reflective surface at the bonding surface may also be selected. For example, a metal substrate or alloy substrate having silver, gold, copper or aluminum or the like at the bonding surface, or a composite substrate in which a metal mirror structure has been formed on a semiconductor may be selected. Selection of a similar material to the strain adjustment layer, which ensures no strain effects as a result of the bonding, is the most desirable.

In order to enable the functional substrate 3 to support the light emitting unit 7 mechanically with a satisfactory degree of strength, the thickness of the functional substrate 3 is preferably not less than approximately 50 μm. Further, in order to facilitate mechanical processing of the functional substrate 3 following bonding to the compound semiconductor layer 2, the thickness of the functional substrate 3 preferably does not exceed approximately 300 μm. In other words, the functional substrate 3 is most preferably formed from an n-type GaP substrate having a thickness of not less than approximately 50 μm and not more than approximately 300 μm.

Furthermore, as illustrated in FIG. 4, the side surface of the functional substrate 3 includes a vertical surface 3a that is positioned relatively closer to the compound semiconductor layer 2 and is substantially perpendicular to the main light extraction surface, and an inclined surface 3b that is positioned relatively distant from the compound semiconductor layer 2 and is inclined inwards relative to the main light extraction surface. This structure enables light emitted towards the functional substrate 3 from the light emitting layer 10 to be extracted externally with good efficiency. Further, of the light emitted towards the functional substrate 3 from the light emitting layer 10, a portion of the light is reflected off the vertical surface 3a and can be extracted at the inclined surface 3b. On the other hand, the portion of the light reflected off the inclined surface 3b can be extracted at the vertical surface 3a. In this manner, a synergistic effect between the vertical surface 3a and the inclined surface 3b enables the light extraction efficiency to be enhanced.

Further, in this embodiment, as illustrated in FIG. 4, an angle α between the inclined surface 3b and a surface parallel to the light emission surface is preferably set within a range from 55 to 80 degrees. By employing an angle within this range, light reflected off the bottom of the functional substrate 3 can be extracted externally with good efficiency.

Furthermore, the depth (in the thickness direction) of the vertical surface 3a is preferably within a range from 30 to 100 μm. By ensuring that the depth of the vertical surface 3a satisfies this range, light reflected off the bottom of the functional substrate 3 can be returned efficiently through the vertical surface 3a to the light emission surface, and can then be emitted from the main light extraction surface. As a result, the light emission efficiency of the light emitting diode 1 can be enhanced.

Furthermore, the inclined surface 3b of the functional substrate 3 is preferably subjected to a surface roughening treatment. Roughening the inclined surface 3b results in improved light extraction efficiency at the inclined surface 3b. In other words, by roughening the inclined surface 3b, total reflection at the inclined surface 3b is inhibited, enabling the light extraction efficiency to be improved.

The bonding interface between the compound semiconductor layer 2 and the functional substrate 3 may sometimes act as a high-resistance layer. In other words, a high-resistance layer, which is not shown in the drawings, may sometimes be provided between the compound semiconductor layer 2 and the functional substrate 3. This high-resistance layer has a higher resistance than the functional substrate 3, and when provided, has an effect of reducing reverse current flow from the strain adjustment layer 8 side of the compound semiconductor layer 2 towards the functional substrate 3. Further, although a bonding structure is employed that exhibits favorable withstand voltage properties relative to voltages inadvertently applied in the reverse direction from the functional substrate 3 to the strain adjustment layer 8, the bonding structure is preferably such that the breakdown voltage is a lower value than the reverse direction voltage for the pn junction-type light emitting unit 7.

The n-ohmic electrode 4 and the p-ohmic electrode 5 are low-resistance ohmic contact electrodes provided on the main light extraction surface of the light emitting diode 1. In this embodiment, the n-ohmic electrode 4 is provided on top of the upper cladding layer 11, and can be formed using AuGe or an alloy composed of a Ni alloy and Au. On the other hand, as illustrated in FIG. 4, the p-ohmic electrode 5 is formed on the exposed surface of the strain adjustment layer 8, and is formed using an alloy composed of AuBe and Au.

In the light emitting diode 1 of the present embodiment, the p-ohmic electrode 5 that functions as the second electrode is preferably formed on top of the strain adjustment layer 8. By employing this type of structure, the operating voltage can be reduced. Further, by forming the p-ohmic electrode 5 on a strain adjustment layer 8 composed of p-type GaP, a favorable ohmic contact can be achieved, enabling a further reduction in the operating voltage.

In the present embodiment, the polarity of the first electrode is preferably n-type, and the polarity of the second electrode is preferably p-type. Using this type of structure enables a higher brightness light emitting diode 1 to be achieved. On the other hand, if the polarity of the first electrode is p-type, then current diffusion deteriorates and the brightness tends to decrease. In contrast, by making the first electrode an n-type electrode, current diffusion is improved, and a higher brightness light emitting diode 1 can be achieved.

As illustrated in FIG. 3, in the light emitting diode 1 of the present embodiment, the n-ohmic electrode 4 and the p-ohmic electrode 5 are preferably disposed in diagonally opposing positions. Further, the periphery of the p-ohmic electrode 5 is preferably surrounded by the compound semiconductor layer 2. By adopting this type of structure, the operating voltage can be reduced. Further, surrounding the p-ohmic electrode 5 on all sides with the n-ohmic electrode 4 facilitates the flow of electric current in all directions, resulting in a reduction in the operating voltage.

Furthermore, in the light emitting diode 1 of the present embodiment, as illustrated in FIG. 3, the n-ohmic electrode 4 is preferably formed as a mesh-like structure such as a honeycomb or grid. Adopting this type of structure enables the reliability to be improved. Further, using a grid-like structure enables current to be introduced more uniformly into the light emitting layer 10, resulting in improved reliability. In the light emitting diode 1 of this embodiment, the n-ohmic electrode 4 is preferably formed from a pad-shaped electrode (a pad electrode) and a linear electrode with a width of not more than 10 µm (a linear electrode). This type of structure enables a higher level of brightness to be obtained. Moreover, by ensuring a narrow width for the linear electrode, the open surface area of the light extraction surface can be increased, enabling a higher level of brightness to be achieved.

As illustrated in FIG. 4, the third electrode 6 is provided on the bottom surface of the functional substrate 3, and has the functions of increasing brightness, providing conductivity, and improving the stability of the mounting step. There are no particular limitations on the material used for the third electrode 6, and for example, a highly reflective silver (Ag) paste can be used. Further, a stacked structure composed of, for example, a reflective layer, a barrier layer and a connection layer can also be used as the third electrode 6. Examples of materials that may be used as the reflective layer include highly reflective metals such as silver, gold, aluminum and platinum, as well as alloys of these metals. Furthermore, an oxide film formed from a transparent conductive film such as indium tin oxide (ITO) or indium zinc oxide (IZO) may be provided between the reflective layer and the functional substrate 3. Examples of materials that may be used for the barrier layer include high-melting point metals such as tungsten, molybdenum, titanium, platinum, chromium or tantalum. Further, examples of materials that may be used as the connection layer include low-melting point eutectic metals such as AuSn, AuGe or AuSi.

The third electrode 6 may be either an ohmic electrode or a Schottky electrode, but if the third electrode 6 is formed as an ohmic electrode on the bottom surface of the functional substrate 3, then the electrode tends to absorb light from the light emitting layer 10, and therefore a Schottky electrode is preferred. Although there are no particular limitations on the thickness of the third electrode 6, the thickness is preferably within a range from 0.2 to 5 µm, more preferably within a range from 1 to 3 µm, and most preferably within a range from 1.5 to 2.5 µm. If the thickness of the third electrode 6 is less than 0.2 µm, then high-level thickness control technology is required, which is undesirable. In contrast, if the thickness of the third electrode 6 exceeds 5 µm, then pattern formation becomes difficult, and the costs tend to increase, both of which are undesirable. On the other hand, provided the thickness of the third electrode 6 satisfies the above-mentioned range, a favorable combination of quality stability and cost can be achieved.

<Method of Producing Light Emitting Diode>

Figure 7:
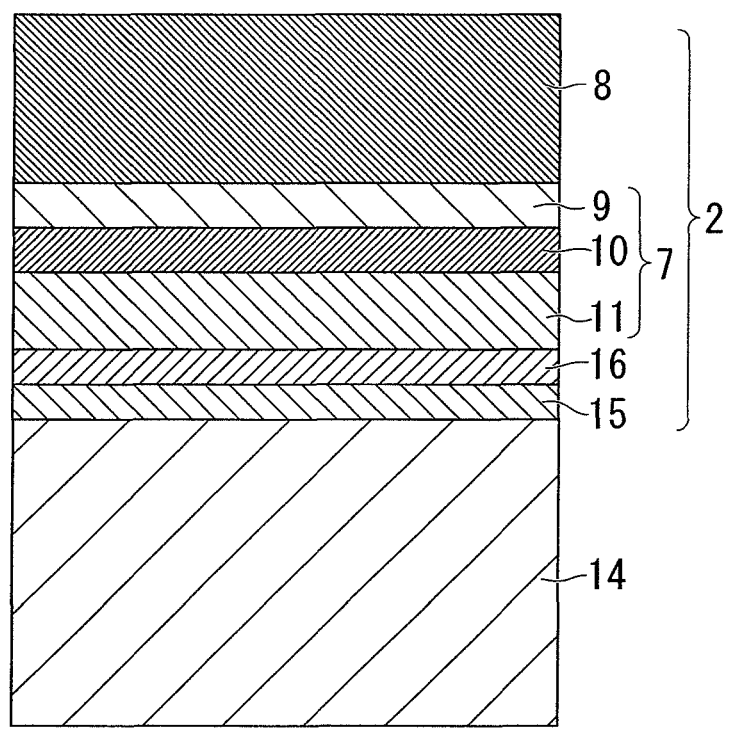
FIG. 7 is a schematic cross-sectional view of an epiwafer used in a light emitting diode according to an embodiment of the present invention.
Figure 8:
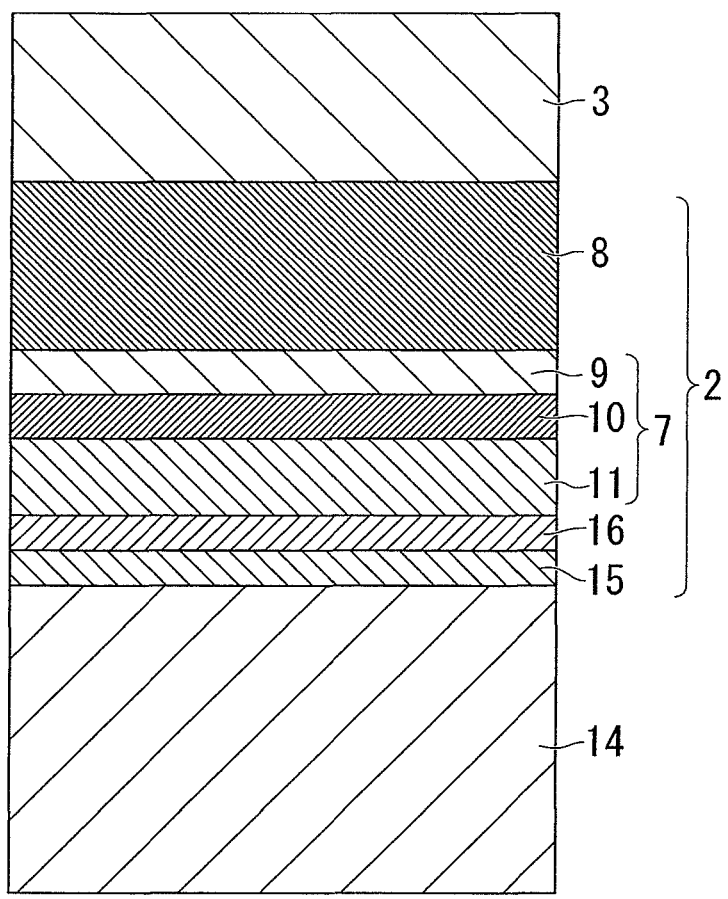
FIG. 8 is a schematic cross-sectional view of a bonded wafer used in a light emitting diode according to an embodiment of the present invention.

Next is a description of a method of producing the light emitting diode 1 according to the present embodiment. FIG. 7 is a cross-sectional view of an epiwafer used in the light emitting diode 1 according to the present embodiment. Further, FIG. 8 is a cross-sectional view of a bonded wafer used in the light emitting diode 1 according to the present embodiment.

(Compound Semiconductor Layer Formation Step)

First, as illustrated in FIG. 7, the compound semiconductor layer 2 is prepared.

The compound semiconductor layer 2 is formed by sequentially stacking, on top of a GaAs substrate 14, a buffer layer 15 formed from GaAs, an etching stop layer (not shown in the figure) that is provided to enable the use of selective etching, a contact layer 16 formed from Si-doped n-type AlGaInP, the n-type upper cladding layer 11, the light emitting layer 10, the p-type lower cladding layer 9, and the strain adjustment layer 8 formed from Mg-doped p-type GaP.

The GaAs substrate 14 may use a commercially available monocrystalline substrate produced using conventional production methods. The surface of the GaAs substrate 14 upon which epitaxial growth is to be performed is preferably smooth. In terms of facilitating epitaxial growth, the planar orientation of the surface of the GaAs substrate 14 is preferably the mass-produced (100) plane and within a range of ±20° off the (100) plane in terms of quality stability. Moreover, the planar orientation of the surface of the GaAs substrate 14 is more preferably 15°±5° off the (100) direction towards the (0-1-1) direction.

In order to improve the crystallinity of the compound semiconductor layer 2, the dislocation density of the GaAs substrate 14 is preferably low. Specifically, the dislocation density is typically not more than 10,000 cm$^{-2}$, and preferably not more than 1,000 cm$^{-2}$.

The GaAs substrate 14 may be an n-type or p-type substrate. The carrier concentration of the GaAs substrate 14 may be selected as appropriate in order to achieve the desired electrical conductivity and device structure. For example, in the case where the GaAs substrate 14 is a silicon-doped n-type substrate, the carrier concentration is preferably within a range from $1\times10^{17}$ to $5\times10^{18}$ cm$^{-3}$. In contrast, in the case where the GaAs substrate 14 is a zinc-doped p-type substrate, the carrier concentration is preferably within a range from $2\times10^{18}$ to $5\times10^{19}$ cm$^{-3}$.

The thickness of the GaAs substrate 14 may be set within an appropriate range in accordance with the substrate size. If the thickness of the GaAs substrate 14 is thinner than this appropriate range, then there is a danger of breakage occurring during the production process for the compound semiconductor layer 2. In contrast, if the thickness of the GaAs substrate 14 is thicker than the appropriate range, then the material costs increase. Accordingly, in those cases where the substrate size of the GaAs substrate 14 is large, for example in the case of a substrate having a diameter of 75 mm, the substrate thickness is preferably within a range from 250 to 500 μm in order to prevent breakage during handling. Similarly, if the substrate diameter is 50 mm, then the thickness is preferably within a range from 200 to 400 μm, whereas if the substrate diameter is 100 mm, the thickness is preferably within a range from 350 to 600 μm.

In this manner, by setting the thickness of the GaAs substrate 14 in accordance with the substrate size, warping of the compound semiconductor layer 2 caused by the strained light emitting layer 7 can be reduced. As a result, the temperature distribution during epitaxial growth becomes more uniform, meaning the wavelength distribution within the plane of the light emitting layer 10 can be narrowed. The shape of the GaAs substrate 14 is not limited to circular shapes, and a rectangular shape or the like may also be used.

The buffer layer 15 is provided to alleviate lattice mismatch between the semiconductor substrate 14 and the layers that constitute the light emitting unit 7. Accordingly, provided the substrate quality and the epitaxial growth conditions are selected appropriately, the buffer layer 15 may not be necessary. The material for the buffer layer 15 is preferably the same material as that of the epitaxial growth substrate. In other words, in the present embodiment, the buffer layer 15 preferably employs the same GaAs as the GaAs substrate 14. In order to reduce the transmission of defects, the buffer layer 15 may employ a multilayer film composed of different materials from the GaAs substrate 14. The thickness of the buffer layer 15 is preferably at least 0.1 μm, and is more preferably 0.2 μm or greater.

The contact layer 16 is provided for the purpose of reducing the contact resistance with the electrodes. The material of the contact layer 16 preferably has a larger band gap than that of the strained light emitting layer 12, and is preferably a material having a composition represented by $Al_XGa_{1-X}As$ or $(Al_XGa_{1-X})_YIn_{1-Y}P$ (wherein X and Y are numerical values that satisfy $0 \leq X \leq 1$ and $0 \leq Y \leq 1$ respectively). Further, in order to reduce the contact resistance with the electrodes, the lower limit for the carrier concentration within the contact layer 16 is preferably not less than $5\times10^{17}$ cm$^{-3}$, and is more preferably $1\times10^{18}$ cm$^{-3}$ or greater. The upper limit for the carrier concentration is preferably not more than $2\times10^{19}$ cm$^{-3}$, at which point the crystallinity tends to deteriorate. The thickness of the contact layer 16 is preferably at least 0.5 μm, and is most preferably 1 μm or greater. Although there are no particular limitations on the upper limit for the thickness of the contact layer 16, in order to ensure that the costs associated with the epitaxial growth fall within an appropriate range, the thickness is preferably not more than 5 μm.

In the present embodiment, conventional growth methods such as molecular beam epitaxy (MBE) and reduced-pressure metalorganic chemical vapor deposition (MOCVD) may be employed. Of these, the use of the MOCVD method, which offers superior applicability to mass production, is particularly desirable. Specifically, the GaAs substrate 14 used for epitaxial growth of the compound semiconductor layer 2 is preferably subjected to preliminary treatments such as washing and heating treatments prior to the growing process in order to remove contaminants and any natural oxide film from the substrate surface. The layers that constitute the abovementioned compound semiconductor layer 2 can be produced by simultaneous epitaxial growth on 8 or more GaAs substrates 14 of diameter 50 to 150 mm positioned inside the MOCVD apparatus. Commercially available large-scale apparatus such as self-rotating or high-speed rotating apparatus may be used as the MOCVD apparatus.

During epitaxial growth of each of the layers of the abovementioned compound semiconductor layer 2, compounds such as trimethylaluminum $((CH_3)_3Al)$, trimethylgallium $((CH_3)_3Ga)$ and trimethylindium $((CH_3)_3In)$ can be used as raw materials for the group III elements. Further, bis(cyclopentadienyl)magnesium $(bis-(C_5H_5)_2Mg)$ or the like can be used as a Mg doping material. Furthermore, disilane $(Si_2H_6)$ or the like can be used as a Si doping material. Moreover, phosphine $(PH_3)$ or Arsine $(AsH_3)$ or the like may be used as raw materials for the group V elements. In terms of the growing temperature used for each of the layers, in those cases where a p-type GaP is used as the strain adjustment layer 8, growth of the strain adjustment layer 8 is typically performed at a temperature within a range from 720 to 770° C., whereas the other layers are typically grown at 600 to 700° C. Moreover, the carrier concentration, thickness and temperature conditions and the like for each layer may be selected as appropriate.

The compound semiconductor layer 2 produced in this manner has a favorable surface state with minimal crystal defects, despite including the strained light emitting layer 12. Further, depending on the device structure, the compound semiconductor layer 2 may be subjected to surface processing such as polishing or the like.

(Transparent Substrate Bonding Step)

Next, the compound semiconductor layer 2 and the functional substrate 3 are bonded together. When bonding the compound semiconductor layer 2 and the functional substrate 3, first, the surface of the strain adjustment layer 8 of the compound semiconductor layer 2 is polished to a mirror finish. Subsequently, the functional substrate 3 that is to be bonded to the surface of this mirror-polished strain adjustment layer 8 is prepared.

The surface of the functional substrate 3 is polished to a mirror finish prior to bonding to the strain adjustment layer 8. Subsequently, the compound semiconductor layer 2 and the functional substrate 3 are installed in a typical semiconductor material bonding apparatus, and the two mirror-polished surfaces are bombarded with electrons under vacuum conditions and irradiated with a neutralized Ar beam. Subsequently, the vacuum conditions are maintained inside the bonding apparatus, while the two surfaces are brought together and a load is applied, thus enabling bonding to be performed at room temperature (see FIG. 8).

(First and Second Electrode Formation Step)

Next, the n-ohmic electrode 4 that acts as the first electrode and the p-ohmic electrode 5 that acts as the second electrode are formed. When forming the n-ohmic electrode 4 and the p-ohmic electrode 5, first, an ammonia-based etchant is used to selectively remove the GaAs substrate 14 and the buffer layer 15 from the compound semiconductor layer 2 that is bonded to the functional substrate 3. Subsequently, the n-ohmic electrode 4 is formed on the surface of the exposed contact layer 16. Specifically, for example, a vacuum deposition method is used to deposit a certain thickness of AuGe or Ni alloy/Pt/Au, and a typical photolithography method is then used to pattern the deposited layer to form the shape of the n-ohmic electrode 4.

Subsequently, portions of the contact layer 16, the upper cladding layer 11, the light emitting layer 10 and the lower cladding layer 9 are selectively removed to expose the strain adjustment layer 8, and the p-ohmic electrode 5 is formed on this exposed surface of the strain adjustment layer 8. Specifically, for example, a vacuum deposition method is used to deposit a certain thickness of AuBe/Au, and a typical photolithography method is then used to pattern the deposited layer to form the shape of the p-ohmic electrode 5. By subsequently performing alloying, by conducting a heat treatment under conditions including a temperature of 400 to 500° C. for a period of 5 to 20 minutes, the low-resistance n-ohmic electrode 4 and p-ohmic electrode 5 can be formed.

(Third Electrode Formation Step)

Next, the third electrode 6 is formed on the opposite surface of the functional substrate 3 to the surface that is bonded to the compound semiconductor layer 2. In those cases where a silver paste is used as the third electrode 6, the silver paste is applied to the surface of the functional substrate. Further, in those cases where a stacked structure is used as the third electrode, a sputtering method may be used to deposit, on the surface of the functional substrate 3, a 0.1 μm ITO film, which is a transparent conductive film that functions as the oxide film, and a 0.1 μm film of silver alloy may then be deposited as a reflective layer. Subsequently, for example, a 0.1 μm film of tungsten is deposited on this reflective layer as a barrier layer. A 0.5 μm film of Au, a 1 μm film of AuSn (eutectic melting point: 283° C.) and a 0.1 μm film of Au are then deposited sequentially on the barrier layer to form a connection layer. A typical photolithography method may then be used to perform patterning into an arbitrary shape, thus forming the third electrode 6. The functional substrate 3 and the third electrode 6 represent a Schottky contact having minimal light absorption.

(Transparent Substrate Processing Step)

Next, the shape of the functional substrate 3 is processed. When processing the functional substrate 3, first, V-shaped slots are formed in the surface of the functional substrate 3 in locations where the third electrode 6 does not exist. The inside surface of the V-shaped slot that faces the third electrode 6 becomes the inclined surface 3b that forms an angle α relative to a surface parallel to the light emission surface. Subsequently, dicing is performed at a predetermined interval from the side of the compound semiconductor layer 2, thus forming chips. The dicing performing during this chipping step forms the vertical surfaces 3a on the functional substrate 3.

There are no particular limitations on the method used for forming the inclined surface 3b, and conventional methods such as wet etching, dry etching, scribing or laser processing may be combined as appropriate, although the use of a dicing method, which offers high levels of shape controllability and productivity, is the most desirable. By employing a dicing method, the production yield can be increased.

Further, although there are no particular limitations on the method used for forming the vertical surfaces 3a, a scribe-break method or a dicing method is preferred. Adopting a scribe-break method enables the production costs to be reduced. In other words, a cutting margin need not be provided during chip separation, meaning larger numbers of light emitting diodes can be produced, thus reducing production costs. On the other hand, a dicing method improves the light extraction efficiency from the vertical surfaces 3a, meaning a higher level of brightness can be achieved.

Finally, if necessary, any fractured layers or soiling caused by the dicing may be removed by etching with a mixed liquid of sulfuric acid and hydrogen peroxide or the like. This enables completion of the production of the light emitting diode 1.

<Method of Producing Light Emitting Diode Lamp>

Next is a description of a method of producing a light emitting diode lamp 41 using the light emitting diode 1 described above, namely, a method of mounting the light emitting diode 1.

As illustrated in FIG. 1 and FIG. 2, a predetermined number of the light emitting diodes 1 are mounted on the surface of the mounting substrate 42. When mounting the light emitting diode 1, the mounting substrate 42 and the light emitting diode 1 are first positioned relative to each other, and the light emitting diode 1 is placed in a predetermined position on the mounting substrate 42. Subsequently, the contact layer of the third electrode 6 and the n-electrode terminal 43 provided on the surface of the mounting substrate 42 are subjected to eutectic metal bonding (eutectic metal die bonding). This secures the light emitting diode 1 to the surface of the mounting substrate 42. The n-ohmic electrode 4 of the light emitting diode 1 and the n-electrode terminal 43 of the mounting substrate 42 are then connected using the gold wire 45 (wire bonding). Similarly, the p-ohmic electrode 5 and the p-electrode terminal 44 of the mounting substrate 42 are connected using the gold wire 46. Finally, the surface of the mounting substrate 42 on which the light emitting diode 1 is mounted is sealed with a typical epoxy resin 47. This completes production of a light emitting diode lamp 41 using the light emitting diode 1.

As follows is a description of the case in which a voltage is applied across the n-electrode terminal 43 and the p-electrode terminal 44 in a light emitting diode lamp 41 having the structure described above.

First is a description of the case where a forward voltage is applied to the light emitting diode lamp 41.

When voltage is applied in the forward direction, a forward current first flows from the p-electrode terminal 44 connected to the anode, through the gold wire 46, and into the p-ohmic electrode 5. The current then flows sequentially from the p-ohmic electrode 5 into the strain adjustment layer 8, the lower cladding layer 9, the light emitting layer 10, the upper cladding layer 11, and the n-ohmic electrode 4. Subsequently, the current flows from the n-ohmic electrode 4, through the gold wire 45, and into the n-electrode terminal 43 connected to the cathode. Because the light emitting diode 1 is provided with a high-resistance layer, the forward current does not flow from the strain adjustment layer 8 into the functional substrate 3 formed from n-type GaP. When the forward current flows in the manner described above, light is emitted from the light emitting layer 10. Further, the light emitted from the light emitting layer 10 is emitted through the main light extraction surface. On the other hand, light emitted from the light emitting layer 10 towards the functional substrate 3 is reflected due to the shape of the functional substrate 3 and the existence of the third electrode 6, and is therefore emitted through the main light extraction surface. Accordingly, an increased level of brightness can be achieved for the light emitting diode lamp 41 (the light emitting diode 1) (see FIG. 2 and FIG. 4).

Further, due to the adjustment of the composition of the light emitting layer 10, the emission spectrum of the light emitting diode lamp 41 has a peak emission wavelength within a range from 655 to 675 nm. Furthermore, because fluctuations in the amount of strain in the strained light emitting layers 12 within the light emitting layer 10 are suppressed by the strain adjustment layer 8, the full width at half maximum of the emission spectrum is within a range from 10 to 40 nm. Moreover, the emission intensity at an emission wavelength of 700 nm is less than 10% of the emission intensity at the peak emission wavelength. Accordingly, the light emitting diode lamp 41 prepared using the light emitting diode 1 can be used favorably as the illumination used for promoting photosynthesis during plant growth.

As described above, the light emitting diode 1 of the present embodiment includes the compound semiconductor layer 2 containing the light emitting unit 7 having the strained light emitting layer 12 with a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively). By using AlGaInP as the material for the strained light emitting layer 12, the light emission efficiency and the response speed of the light emitting unit 7 can be improved. Further, by restricting the composition of the strained light emitting layer 12 to the ranges described above, a light emitting diode 1 having an emission wavelength of 655 nm or greater can be produced.

Furthermore, in the light emitting diode 1 of the present embodiment, the strain adjustment layer 8 is provided on the light emitting unit 7. This strain adjustment layer 8 is transparent to the emission wavelength, and therefore a high-output and/or high-efficiency light emitting diode 1 can be produced that does not absorb the light emitted from the light emitting unit 7. Moreover, because this strain adjustment layer 8 has a smaller lattice constant than the lattice constant of the GaAs substrate 14, warping of the compound semiconductor layer 2 can be suppressed. As a result, fluctuations in the amount of strain in the strained light emitting layers 12 within the light emitting layer 10 are reduced, enabling the production of a light emitting diode 1 having excellent monochromaticity.

Accordingly, the present embodiment is able to provide a light emitting diode 1 that has an emission wavelength of not less than 655 nm, exhibits excellent monochromaticity, high output and/or high efficiency, and has a fast response speed. Further, the present embodiment is also able to provide a high-output light emitting diode 1 that has a light emission efficiency approximately 4 times or more that of conventional AlGaAs-based light emitting diodes.

Furthermore, the light emitting diode lamp 41 of the present embodiment includes the light emitting diode 1 that has an emission wavelength of not less than 655 nm, exhibits excellent monochromaticity, high output and/or high efficiency, and has a fast response speed. Accordingly, a light emitting diode lamp 41 can be provided that is ideal for illumination for plant growth.

EXAMPLES

The effects of the present invention are described in further detail below using a series of examples, although the present invention is in no way limited by these examples.

In the examples, specific descriptions are provided of examples of producing light emitting diodes according to the present invention. The light emitting diodes produced in the examples are red light emitting diodes having an AlGaInP light emitting unit. In the examples, each light emitting diode was prepared by bonding together a compound semiconductor layer grown on top of a GaAs substrate, and a functional substrate composed of GaP. In order to evaluate the properties of the light emitting diode, a light emitting diode lamp having a light emitting diode chip mounted on a substrate was prepared.

Example 1

In a light emitting diode of Example 1, first, an epitaxial wafer was prepared by sequentially stacking compound semiconductor layers on top of a GaAs substrate composed of monocrystalline Si-doped n-type GaAs.

In the GaAs substrate, the growth plane was inclined 15° from the (100) plane towards the (0-1-1) direction, and the carrier concentration was $2 \times 10^{18}$ cm$^{-3}$. The thickness of the GaAs substrate was approximately 0.5 μm. The compound semiconductor layers included an n-type buffer layer composed of Si-doped GaAs, an n-type contact layer composed of Si-doped $(Al_{0.7}Ga_{0.3})_{0.5}In_{0.5}P$, an n-type upper cladding layer composed of Si-doped $(Al_{0.7}Ga_{0.3})_{0.5}In_{0.5}P$, a strained light emitting layer/barrier layer composed of pairs of undoped $Ga_{0.44}In_{0.56}P/(Al_{0.53}Ga_{0.47})_{0.5}In_{0.5}P$, a p-type lower cladding layer composed of Mg-doped $(Al_{0.7}Ga_{0.3})_{0.5}In_{0.5}P$, a thin-film intermediate layer composed of $(Al_{0.5}Ga_{0.5})_{0.5}In_{0.5}P$, and a strain adjustment layer composed of Mg-doped p-type GaP.

In this example, a reduced-pressure metalorganic chemical vapor deposition apparatus (MOCVD apparatus) was used, and an epitaxial wafer was formed by performing epitaxial growth of the compound semiconductor layers on a GaAs substrate having a diameter of 76 mm and a thickness of 350 μm. During growth of the epitaxial growth layers, trimethylaluminum ($(CH_3)_3Al$), trimethylgallium ($(CH_3)_3Ga$) and trimethylindium ($(CH_3)_3In$) were used as the raw materials for the group III elements. Further, bis(cyclopentadienyl)magnesium (bis-$(C_5H_5)_2Mg$) was used as the Mg doping material. Furthermore, disilane ($Si_2H_6$) was used as the Si doping material. Moreover, phosphine ($PH_3$) and Arsine ($AsH_3$) were used as the raw materials for the group V elements. In terms of the growing temperature used for each of the layers, growth of the strain adjustment layer composed of p-type GaP was performed at 750° C., whereas each of the other layers was grown at 700° C.

The buffer layer composed of GaAs had a carrier concentration of approximately $2 \times 10^{18}$ cm$^{-3}$ and a thickness of approximately 0.5 μm. The contact layer had a carrier concentration of approximately $2 \times 10^{18}$ cm$^{-3}$ and a thickness of approximately 3.5 μm. The upper cladding layer had a carrier concentration of approximately $1 \times 10^{18}$ cm$^{-3}$ and a thickness of approximately 0.5 μm. Each strained light emitting layer was composed of a layer of undoped $Ga_{0.44}In_{0.56}P$ with a thickness of approximately 17 nm, and each barrier layer was composed of a layer of undoped $(Al_{0.53}Ga_{0.47})_{0.5}In_{0.5}P$ with a thickness of approximately 19 nm. 22 pairs of the strained light emitting layer and barrier layer were stacked in an alternating manner. The lower cladding layer had a carrier concentration of approximately $8\times10^{17}$ cm$^{-3}$ and a thickness of approximately 0.5 µm. The intermediate layer had a carrier concentration of approximately $8\times10^{17}$ cm$^{-3}$ and a thickness of approximately 0.05 µm. The strain adjustment layer composed of GaP had a carrier concentration of approximately $3\times10^{18}$ cm$^{-3}$ and a thickness of approximately 9 µm.

Next, the strain adjustment layer was polished down to a depth of approximately 1 µm from the surface, forming a mirror finish. This mirror finishing reduced the roughness of the strain adjustment layer surface to 0.18 nm. Meanwhile, the functional substrate composed of n-type GaP was prepared for subsequent bonding to this mirror-polished surface of the strain adjustment layer. Si was added to this functional substrate for bonding in sufficient amount to yield a carrier concentration of approximately $2\times10^{17}$ cm$^{-3}$, and a monocrystalline substrate with a planar orientation of (111) was prepared. The diameter of the functional substrate was 76 mm, and the thickness was 250 µm. Prior to bonding to the strain adjustment layer, the surface of this functional substrate was polished to a mirror finish, with a root mean square value of 0.12 nm.

Next, the above-mentioned functional substrate and the epitaxial wafer having the strain adjustment layer were installed in a typical semiconductor material bonding apparatus, and the inside of the apparatus was evacuated down to a vacuum of $3\times10^{-5}$ Pa.

Subsequently, the surfaces of both the functional substrate and the strain adjustment layer were bombarded with electrons and irradiated with a neutralized Ar beam for a period of 3 minutes. The vacuum conditions were then maintained inside the bonding apparatus, while the surfaces of the functional substrate and the strain adjustment layer were brought together. A load was applied that produced a pressure of 50 g/cm² at each of the surfaces, thus bonding the two surfaces together at room temperature. This completed the formation of a bonded wafer.

Next, the GaAs substrate and the GaAs buffer layer were selectively removed from the bonded wafer using an ammonia-based etchant. Subsequently, a first electrode was formed on the surface of the contact layer by using a vacuum deposition method to deposit 0.5 µm films of AuGe and Ni alloy, 0.2 µm of Pt, and then 1 µm of Au. Patterning was then performed using a typical photolithography method, thus forming an n-ohmic electrode that functioned as the first electrode. Next, a surface roughening treatment was performed on the surface of the light extraction surface, namely the surface from which the GaAs had been removed.

Next, the epilayers were removed selectively from a region in which a p-ohmic electrode was to be formed as the second electrode, thus exposing the strain adjustment layer. A vacuum deposition method was then used to deposit 0.2 µm of AuBe and 1 µm of Au on the surface of the exposed strain adjustment layer, thus forming a p-ohmic electrode. Subsequently, alloying was performed by conducting a heat treatment at 450° C. for 10 minutes, thus completing formation of low-resistance p-type and n-type ohmic electrodes.

Next, a third electrode for connection purposes was formed on the back surface of the functional substrate by depositing an Au film of thickness 0.2 µm, a Pt film of thickness 0.2 µm, and an AuSn film of thickness 1.2 µm.

Next, a dicing saw was used to cut V-shaped slots in those regions on the back surface of the functional substrate in which the third electrode was not formed, with the dimensions of the V-shaped slots adjusted so as to yield an angle α for the inclined surfaces of 70° and a vertical surface thickness of 80 µm. Subsequently, a dicing saw was used to cut the structure from the side of the compound semiconductor layer at intervals of 350 µm, thus forming a series of chips. Fractured layers and soiling caused by the dicing were removed by etching with a mixed solution of sulfuric acid and hydrogen peroxide, completing preparation of light emitting diodes of Example 1.

One hundred light emitting diode lamps were assembled, with each lamp prepared by mounting a light emitting diode chip of Example 1, prepared in the manner described above, on a mounting substrate. Each of these light emitting diode lamps was assembled by performing thermal bonding inside a eutectic die bonder to mount the light emitting diode chip on the mounting substrate, wire bonding the n-type ohmic electrode of the light emitting diode to the n-electrode terminal provided on the surface of the mounting substrate using a gold wire, wire bonding the p-type ohmic electrode of the light emitting diode to the p-electrode terminal using a gold wire, and then sealing the lamp with a typical epoxy resin.

The results of evaluating the properties of these light emitting diodes (light emitting diode lamps) are shown in Table 1. As is evident from Table 1, when an electric current was passed between the n-type and p-type ohmic electrodes, red light with a peak wavelength of 660 nm was emitted. The forward voltage (Vf) observed when an electric current of 20 milliamperes (mA) flowed though the device in the forward direction was approximately 2.0 volts (V), reflecting the low resistance at the bonding interface between the strain adjustment layer of the compound semiconductor layer and the functional substrate, and the favorable ohmic properties of each of the ohmic electrodes. The light emission output when the forward direction electric current was 20 mA was 20 mW. The fluctuation in the peak wavelength (maximum–minimum) across all of the assembled light emitting diode chips was 2.1 nm. The response speed indicating the rise time for emission (Tr) was 70 ns.

Figure 9:
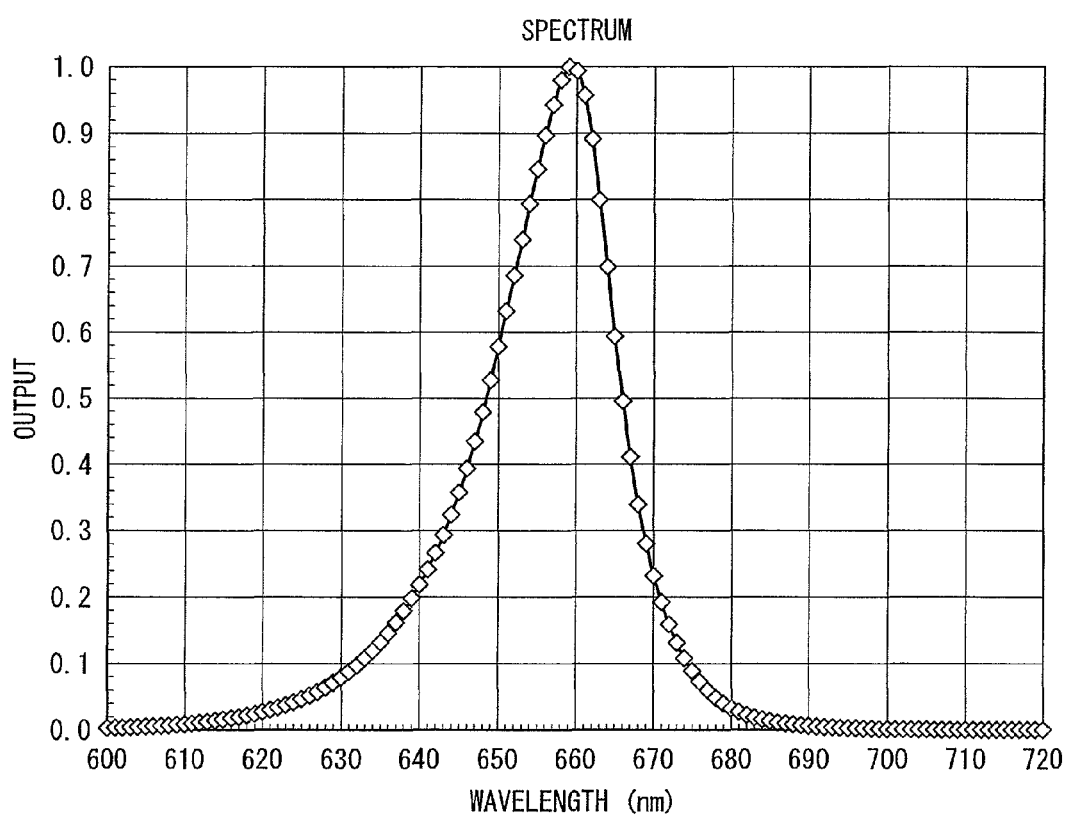
FIG. 9 is a diagram illustrating the emission spectrum of a light emitting diode lamp according to an example of the present invention.

As illustrated in FIG. 9, the emission spectrum of a light emitting diode lamp of Example 1 had a full width at half maximum of 18 nm, and the emission intensity at a wavelength of 700 nm was substantially zero.

Example 2

In the light emitting diode of Example 2, only the compositions of the strained light emitting layer and the barrier layer were altered from the light emitting diode of Example 1. In the light emitting diode of Example 2, the strained light emitting layer from the above Example 1 was altered to a layer of undoped $Ga_{0.42}In_{0.58}P$ with a thickness of approximately 10 nm, the barrier layer from Example 1 was altered to a layer of undoped $(Al_{0.53}Ga_{0.47})_{0.5}In_{0.5}P$ with a thickness of approximately 30 nm, and 22 pairs of the strained light emitting layer and barrier layer were stacked in an alternating manner.

The results of evaluating the properties of light emitting diode lamps prepared by mounting the light emitting diodes of Example 2 are shown in Table 1. As is evident from Table 1, when an electric current was passed between the n-type and p-type ohmic electrodes, red light with a peak wavelength of 660.5 nm was emitted. The forward voltage (Vf) observed when an electric current of 20 milliamperes (mA) flowed though the device in the forward direction was approximately 2.0 volts (V). Further, the emission output when the forward direction electric current was 20 mA was 18 mW. The fluctuation in the peak wavelength across all of the assembled light emitting diode lamps was 2.3 nm. The response speed indicating the rise time for emission (Tr) was 68 ns.

Example 3

In the light emitting diode of Example 3, only the composition of the strained light emitting layer was altered from the light emitting diode of Example 2. In the light emitting diode of Example 3, the strained light emitting layer from the above Example 2 was altered to a layer of undoped $Ga_{0.41}In_{0.59}P$ with a thickness of approximately 15 nm.

The results of evaluating the properties of light emitting diode lamps prepared by mounting the light emitting diodes of Example 3 are shown in Table 1. As is evident from Table 1, when an electric current was passed between the n-type and p-type ohmic electrodes, red light with a peak wavelength of 668.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 19 mW. The fluctuation in the peak wavelength across all of the assembled light emitting diode lamps was 2.5 nm. The response speed indicating the rise time for emission (Tr) was 71 ns.

Example 4

In the light emitting diode of Example 4, only the composition of the strained light emitting layer was altered from the light emitting diode of Example 2. In the light emitting diode of Example 4, the well layer from the above Example 2 was altered to a layer of undoped $Ga_{0.45}In_{0.55}P$ with a thickness of approximately 25 nm.

The results of evaluating the properties of light emitting diode lamps prepared by mounting the light emitting diodes of Example 4 are shown in Table 1. As is evident from Table 1, when an electric current was passed between the n-type and p-type ohmic electrodes, red light with a peak wavelength of 656.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 20 mW. The fluctuation in the peak wavelength across all of the assembled light emitting diode lamps was 2.1 nm. The response speed indicating the rise time for emission (Tr) was 66 ns.

Example 5

In the light emitting diode of Example 5, only the composition of the strained light emitting layer was altered from the light emitting diode of Example 2. In the light emitting diode of Example 5, the strained light emitting layer from the above Example 2 was altered to a layer of undoped $Ga_{0.39}In_{0.61}P$ with a thickness of approximately 10 nm.

The results of evaluating the properties of light emitting diode lamps prepared by mounting the light emitting diodes of Example 5 are shown in Table 1. As is evident from Table 1, when an electric current was passed between the n-type and p-type ohmic electrodes, red light with a peak wavelength of 670.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 18 mW. The fluctuation in the peak wavelength across all of the assembled light emitting diode lamps was 2.9 nm. The response speed indicating the rise time for emission (Tr) was 66 ns.

Comparative Example 1

In the light emitting diode of Comparative Example 1, the surface layer from the light emitting diode of Example 2 was altered to a layer having no strain. In the light emitting diode of Comparative Example 1, the strain adjustment layer from the above Example 2 was altered to a layer of $(Al_{0.7}Ga_{0.3})_{0.5}In_{0.5}P$.

The results of evaluating the properties of light emitting diode lamps prepared by mounting the light emitting diodes of Comparative Example 1 are shown in Table 1. As is evident from Table 1, when an electric current was passed between the n-type and p-type ohmic electrodes, red light with a peak wavelength of 660 nm was emitted. The forward voltage (Vf) observed when an electric current of 20 milliamperes (mA) flowed though the device in the forward direction was approximately 2.1 volts (V). Further, the emission output when the forward direction electric current was 20 mA was 13 mW. The fluctuation in the peak wavelength across all of the assembled light emitting diode lamps was 71 nm. The response speed indicating the rise time for emission (Tr) was 65 ns. The emission wavelength distribution was broad, and the properties were unsatisfactory.

Comparative Example 2

In the light emitting diode of Comparative Example 2, only the composition of the strained light emitting layer was altered from the light emitting diode of Example 2. In the light emitting diode of Comparative Example 2, the strained light emitting layer from the above Example 2 was altered to a layer of undoped $Ga_{0.38}In_{0.62}P$ with a thickness of approximately 5 nm.

The results of evaluating the properties of light emitting diode lamps prepared by mounting the light emitting diodes of Comparative Example 2 are shown in Table 1. As is evident from Table 1, when an electric current was passed between the n-type and p-type ohmic electrodes, red light with a peak wavelength of 651.5 nm was emitted. The forward voltage (Vf) observed when an electric current of 20 milliamperes (mA) flowed though the device in the forward direction was approximately 2.0 volts (V). Further, the emission output when the forward direction electric current was 20 mA was 16 mW. The fluctuation in the peak wavelength across all of the assembled light emitting diode lamps was 5.1 nm. The response speed indicating the rise time for emission (Tr) was 42 ns. The emission wavelength decreased to less than 655 nm as a result of quantum effects, and the properties were unsatisfactory.

Comparative Example 3

In the light emitting diode of Comparative Example 3, only the composition of the strained light emitting layer was altered from the light emitting diode of Example 2. In the light emitting diode of Comparative Example 3, the composition of the strained light emitting layer from the above Example 2 was altered to $Ga_{0.37}In_{0.63}P$.

In the epitaxial wafers prepared in Comparative Example 3, crystal defects (hatching) caused by the composition of the strained light emitting layer occurred on the surface of the strain adjustment layer composed of p-type GaP.

The results of evaluating the properties of light emitting diode lamps prepared by mounting the light emitting diodes of Comparative Example 3 are shown in Table 1. As is evident from Table 1, when an electric current was passed between the n-type and p-type ohmic electrodes, red light with a peak wavelength of 677.7 nm was emitted. The forward voltage (Vf) observed when an electric current of 20 milliamperes (mA) flowed though the device in the forward direction was approximately 2.2 volts (V). Further, the emission output when the forward direction electric current was 20 mA was 5 mW. The fluctuation in the peak wavelength across all of the assembled light emitting diode lamps was 3.8 nm. The response speed indicating the rise time for emission (Tr) was 45 ns. The emission output was low due to the above-mentioned occurrence of defects in the strain adjustment layer, and the properties were unsatisfactory.

Comparative Example 4

In the light emitting diode of Comparative Example 4, only the composition of the strained light emitting layer was altered from the light emitting diode of Example 1.

In the light emitting diode of Comparative Example 4, the composition of the strained light emitting layer from the above Example 1 was altered to $Ga_{0.48}In_{0.52}P$.

The results of evaluating the properties of light emitting diode lamps prepared by mounting the light emitting diodes of Comparative Example 4 are shown in Table 1. As is evident from Table 1, when an electric current was passed between the n-type and p-type ohmic electrodes, red light with a peak wavelength of 647.7 nm was emitted. The forward voltage (Vf) observed when an electric current of 20 milliamperes (mA) flowed though the device in the forward direction was approximately 2.0 volts (V). Further, the emission output when the forward direction electric current was 20 mA was 16 mW. The fluctuation in the peak wavelength across all of the assembled light emitting diode lamps was 2.7 nm. The response speed indicating the rise time for emission (Tr) was 62 ns. The emission wavelength decreased to less than 655 nm, and the properties were unsatisfactory.

Comparative Example 5

In the light emitting diode of Comparative Example 5, only the compositions of the strained light emitting layer and the barrier layer were altered from the light emitting diode of Example 2. In the light emitting diode of Comparative Example 5, the strained light emitting layer from the above Example 2 was altered to a layer of undoped $Ga_{0.44}In_{0.56}P$ with a thickness of approximately 30 nm, the barrier layer from Example 1 was altered to a layer of undoped $(Al_{0.53}Ga_{0.47})_{0.5}In_{0.5}P$ with a thickness of approximately 30 nm, and 12 pairs of the strained light emitting layer and barrier layer were stacked in an alternating manner.

In the epitaxial wafers prepared in Comparative Example 5, crystal defects (hatching) caused by the composition of the strained light emitting layer occurred on the surface of the strain adjustment layer composed of p-type GaP.

The results of evaluating the properties of light emitting diode lamps prepared by mounting the light emitting diodes of Comparative Example 5 are shown in Table 1. As is evident from Table 1, when an electric current was passed between the n-type and p-type ohmic electrodes, red light with a peak wavelength of 668.9 nm was emitted. The forward voltage (Vf) observed when an electric current of 20 milliamperes (mA) flowed though the device in the forward direction was approximately 2.3 volts (V). Further, the emission output when the forward direction electric current was 20 mA was 3 mW. The fluctuation in the peak wavelength across all of the assembled light emitting diode lamps was 4.1 nm. The response speed indicating the rise time for emission (Tr) was 43 ns. The emission output was low due to the occurrence of defects, and the properties were unsatisfactory.

Comparative Example 6

A light emitting diode of Comparative Example 6 was formed using the conventional technique of liquid phase epitaxy. The device structure was altered to a light emitting diode having a light emitting unit with a double hetero structure in which an $Al_{0.35}Ga_{0.65}As$ light emitting layer was formed on a GaAs substrate.

Specifically, in the preparation of the light emitting diode of Comparative Example 6, a liquid phase epitaxial method was used to form, on an n-type GaAs monocrystalline substrate having a planar orientation of (100), an n-type upper cladding layer composed of $Al_{0.7}Ga_{0.3}As$ having a thickness of 20 μm, an undoped light emitting layer composed of $Al_{0.35}Ga_{0.65}As$ having a thickness of 2 μm, a p-type lower cladding layer composed of $Al_{0.7}Ga_{0.3}As$ having a thickness of 20 μm, and a p-type thick film composed of $Al_{0.6}Ga_{0.4}As$ of thickness 120 μm that was transparent to the emission wavelength. Following epitaxial growth of the above layers, the GaAs substrate was removed. Next, an n-ohmic electrode of diameter 100 μm was formed on the surface of the n-type AlGaAs. Subsequently, p-type ohmic electrodes having a diameter of 20 μm were formed with a spacing of 80 μm on the back surface of the p-type AlGaAs. A dicing saw was then used to cut the structure at intervals of 350 μm, and the fractured layers were removed by etching, thus yielding light emitting diode chips of Comparative Example 6.

The results of evaluating the properties of light emitting diode lamps prepared by mounting the light emitting diodes of Comparative Example 6 are shown in Table 1. As is evident from Table 1, when an electric current was passed between the n-type and p-type ohmic electrodes, red light with a peak wavelength of 661.1 nm was emitted. The forward voltage (Vf) observed when an electric current of 20 milliamperes (mA) flowed though the device in the forward direction was approximately 1.9 volts (V). Further, the emission output when the forward direction electric current was 20 mA was 4 mW. The fluctuation in the peak wavelength across all of the assembled light emitting diode lamps was 6.7 nm. The output was low, and the response speed (Tr) was 150 ns, both of which represent unsatisfactory properties.

(Production of Illumination Device)

Selecting the light emitting diode lamp described in Example 1 from among the various light emitting diode lamps described above in Examples 1 to 5, the lamp was secured inside an illumination device reflector prepared in accordance with the content disclosed in Japanese Unexamined Patent Application, First Publication No. 2008-16412, and an illumination device having a plurality of these reflectors (and including a substrate containing power source wiring and through-holes and the like formed therein) was produced. The content of Japanese Unexamined Patent Application, First Publication No. 2008-16412 is included herein by reference.

TABLE 1

|  | Strain adjustment layer | Value of x in light emitting layer $Ga_xIn(1-x)P$ | Strained light emitting layer thickness nm | Number of strained light emitting layers | Barrier layer thickness nm | Number of barrier layers | Surface defects | VF @ 20 mA V | Output @ 20 mA mW | Peak wavelength nm | In-plane fluctuation in peak wavelength nm | Response speed (Tr) ns |
|---|---|---|---|---|---|---|---|---|---|---|---|---|
| Example 1 | GaP | 0.44 | 17 | 23 | 19 | 22 | ◦ | 2.0 | 20 | 660.0 | 2.1 | 70 |
| Example 2 | GaP | 0.42 | 10 | 21 | 30 | 20 | ◦ | 2.0 | 18 | 660.5 | 2.3 | 68 |
| Example 3 | GaP | 0.41 | 15 | 21 | 30 | 20 | ◦ | 2.0 | 19 | 668.0 | 2.5 | 71 |

TABLE 1-continued

|  | Strain adjustment layer | Value of x in light emitting layer GaxIn(1 − x)P | Strained light emitting layer thickness nm | Number of strained light emitting layers | Barrier layer thickness nm | Number of barrier layers | Surface defects | VF @ 20 mA V | Output @ 20 mA mW | Peak wavelength nm | In-plane fluctuation in peak wavelength nm | Response speed (Tr) ns |
|---|---|---|---|---|---|---|---|---|---|---|---|---|
| Example 4 | GaP | 0.45 | 25 | 21 | 30 | 20 | o | 2.0 | 20 | 656.0 | 2.1 | 66 |
| Example 5 | GaP | 0.39 | 10 | 21 | 30 | 20 | o | 2.0 | 18 | 670.0 | 2.9 | 65 |
| Comparative example 1 | Al0.7GaInP | 0.42 | 10 | 21 | 30 | 20 | o | 2.1 | 13 | 660.0 | 7.1 | 65 |
| Comparative example 2 | GaP | 0.38 | 5 | 21 | 30 | 20 | o | 2.0 | 16 | 651.5 | 5.1 | 42 |
| Comparative example 3 | GaP | 0.37 | 10 | 21 | 30 | 20 | x | 2.2 | 5 | 677.7 | 3.8 | 45 |
| Comparative example 4 | GaP | 0.48 | 17 | 23 | 19 | 22 | o | 2.0 | 16 | 647.7 | 2.7 | 62 |
| Comparative example 5 | GaP | 0.44 | 30 | 13 | 30 | 12 | x | 2.3 | 3 | 668.9 | 4.1 | 43 |
| Comparative example 6 | AlGaAs | — | — | — | — | — | o | 1.9 | 4 | 661.1 | 6.7 | 150 |

INDUSTRIAL APPLICABILITY

The light emitting diode of the present invention achieves highly efficient emission of red light of 660 nm, and can be used in high-output light emitting diode products such as light sources for plant growth applications which have been unobtainable using conventional AlGaAs LEDs. Further, the light emitting diode can also be used as a high-output alternative to conventional AlGaAs light emitting layer-based LEDs

DESCRIPTION OF THE REFERENCE SIGNS

1: Light emitting diode
2: Compound semiconductor layer
3: Functional substrate
3a: Vertical surface
3b: Inclined surface
4: n-ohmic electrode (first electrode)
5: p-ohmic electrode (second electrode)
6: Third electrode
7: Light emitting unit
8: Strain adjustment layer
9: Lower cladding layer
10: Light emitting layer
11: Upper cladding layer
12: Strained light emitting layer
13: Barrier layer
14: GaAs substrate
15: Buffer layer
16: Contact layer
41: Light emitting diode lamp
42: Mounting substrate
43: n-electrode terminal
44: p-electrode terminal
45, 46: Gold wire
47: Epoxy resin
α: Angle between the inclined surface and a surface parallel to the light emission surface
100, 101: Illumination device

The invention claimed is:

1. A light emitting diode comprising a compound semiconductor layer having at least a pn junction-type light emitting unit and a strain adjustment layer stacked on the light emitting unit, wherein
the light emitting unit has a stacked structure comprising:
(i) a plurality of strained light emitting layers having a composition formula of $Ga_YIn_{1-Y}P$, wherein Y is a numerical value that satisfies $0.39 \leq Y \leq 0.45$, a thickness ranging from 8 to 30 nm, and a peak emission wavelength ranging from 655 nm to 675 nm, wherein the number of the strained light emitting layers in the light emitting unit is from 8 to 40; and
(ii) a plurality of barrier layers having a composition formula of $(Al_XGa_{1-X})_YIn_{1-Y}P$, wherein X and Y are numerical values that satisfy $0.3 \leq X \leq 0.7$ and $0.48 \leq Y \leq 0.52$ respectively,
wherein the individual ones of the strained light emitting layer and the barrier layer are alternatively stacked, and the strain adjustment layer is transparent to an emission wavelength, has a thickness of 3 to 15 μm, and has a lattice constant that is smaller than lattice constants of the strained light emitting layer and the barrier layer.

2. The light emitting diode according to claim 1, wherein the light emitting unit comprises a cladding layer on one or both of an upper surface and a lower surface of the strained light emitting layer, and
a composition formula of the cladding layer is $(Al_XGa_{1-X})_YIn_{1-Y}P$, wherein X and Y are numerical values that satisfy $0.5 \leq X \leq 1$ and $0.48 \leq Y \leq 0.52$, respectively.

3. The light emitting diode according to claim 1, wherein a composition formula of the strain adjustment layer is $(Al_XGa_{1-X})_YIn_{1-Y}P$, wherein X and Y are numerical values that satisfy $0 \leq X \leq 1$ and $0.6 \leq Y \leq 1$, respectively.

4. The light emitting diode according to claim 1, wherein a composition formula of the strain adjustment layer is $Al_XGa_{1-X}As_{1-Y}P_Y$, wherein X and Y are numerical values that satisfy $0 \leq X \leq 1$ and $0.6 \leq Y \leq 1$, respectively.

5. The light emitting diode according to claim 1, wherein a material of the strain adjustment layer is GaP.

6. The light emitting diode according to claim 1, wherein a thickness of the strain adjustment layer is within a range from 0.5 to 20 μm.

7. The light emitting diode according to claim 1, wherein a functional substrate is bonded to a surface of the compound semiconductor layer on an opposite side to a light extraction surface.

8. The light emitting diode according to claim 7, wherein the functional substrate is transparent.

9. The light emitting diode according to claim 7, wherein a material of the functional substrate is GaP.

10. The light emitting diode according to claim 7, wherein a side surface of the functional substrate comprises a vertical surface that is positioned relatively closer to the compound semiconductor layer and is substantially perpendicular to the light extraction surface, and an inclined surface that is positioned relatively distant from the compound semiconductor layer and is inclined inwards relative to the light extraction surface.

11. The light emitting diode according to claim 7, further comprising:
    first and second electrodes provided on the light extraction surface side of the compound semiconductor layer, and
    a third electrode used for connection purposes that is provided on a back surface of the functional substrate.

12. The light emitting diode according to claim 11, wherein the first and second electrodes are ohmic electrodes.

13. The light emitting diode according to claim 7, wherein the light extraction surface comprises a rough surface.

14. The light emitting diode according to claim 1, which is used for promoting photosynthesis during plant growth.

15. The light emitting diode according to claim 14, wherein a full width at half maximum of the emission spectrum is within a range from 10 to 40 nm.

16. The light emitting diode according to claim 14, wherein an emission intensity at an emission wavelength of 700 nm in the emission spectrum is less than 10% of an emission intensity at the peak emission wavelength.

17. The light emitting diode according to claim 1, wherein a response speed (Tr) of the light emitting unit is not more than 100 ns.

18. A light emitting diode lamp, comprising the light emitting diode according to claim 1.

19. The light emitting diode lamp according to claim 18, wherein a first electrode or a second electrode provided on the light extraction surface side of the light emitting diode and a third electrode are connected substantially equipotentially.

20. An illumination device, comprising the light emitting diode lamp according to claim 18.

21. The light emitting diode according to claim 1, wherein the barrier layer has a thickness that is larger than that of the strained light emitting layer.

* * * * *